(12) United States Patent
Moody et al.

(10) Patent No.: US 6,871,815 B2
(45) Date of Patent: Mar. 29, 2005

(54) STATIC BUILD UP CONTROL IN ELECTRONIC DISPENSING SYSTEMS

(75) Inventors: John R. Moody, Neenah, WI (US); Joshua M. Broehl, Worthington, OH (US)

(73) Assignee: Georgia-Pacific Corporation, Atlanta, GA (US)

( * ) Notice: Subject to any disclaimer, the term of this patent is extended or adjusted under 35 U.S.C. 154(b) by 107 days.

(21) Appl. No.: 09/966,124

(22) Filed: Sep. 27, 2001

(65) Prior Publication Data

US 2002/0109034 A1 Aug. 15, 2002

Related U.S. Application Data

(63) Continuation-in-part of application No. 09/780,733, filed on Feb. 9, 2001, now Pat. No. 6,592,067.

(51) Int. Cl.[7] .............................................. B65H 19/00
(52) U.S. Cl. ............................... 242/559.2; 242/564.4; 242/906
(58) Field of Search ........................... 242/564.4, 559.2, 242/560.1, 563, 590, 596, 906; 312/34.8, 34.22

(56) References Cited

U.S. PATENT DOCUMENTS

| | | |
|---|---|---|
| 2,193,759 A | 3/1940 | Birr |
| 2,839,345 A | 6/1958 | Engel et al. |
| 2,859,814 A | 11/1958 | Berney |
| 2,930,663 A | 3/1960 | Weiss |
| 3,007,650 A | 11/1961 | Burton |
| 3,269,592 A | 8/1966 | Slye |
| 3,288,387 A | 11/1966 | Craven, Jr. |
| 3,384,280 A | 5/1968 | Summersby |
| 3,628,743 A | 12/1971 | Bastian |
| 3,635,417 A | 1/1972 | Kajiwara et al. |
| 3,730,409 A | 5/1973 | Ratti |
| 3,743,865 A | 7/1973 | Riechmann ............. 307/308 |
| 3,850,356 A | 11/1974 | Abe et al. |
| 3,858,951 A | 1/1975 | Rasmussen |
| 3,917,191 A | 11/1975 | Graham, Jr. et al. |
| 4,099,118 A | 7/1978 | Franklin et al. |
| 4,106,684 A | 8/1978 | Hartbauer et al. |
| 4,148,442 A | 4/1979 | Baumann et al. |
| 4,159,807 A | 7/1979 | Honsel et al. |
| 4,165,138 A | 8/1979 | Hedge et al. |

(Continued)

FOREIGN PATENT DOCUMENTS

| | | |
|---|---|---|
| DE | 3342921 A1 | 6/1985 |
| EP | 0 459 050 A1 | 12/1991 |
| EP | 0 459 050 B1 | 8/1993 |
| FR | 2 583 729 | 12/1986 |
| GB | 2267271 A | 12/1993 |

*Primary Examiner*—John Q. Nguyen
(74) *Attorney, Agent, or Firm*—Fulbright & Jaworski L.L.P.

(57) ABSTRACT

Apparatus for dispensing paper from rolls which feeds continuously, roll to roll, and does not require extra procedure to bring stub roll into position. The apparatus has device for holding and positioning at least first and second rolls of paper with respect to each other; device for dispensing paper from the first roll; device for dispensing paper from the first and second rolls simultaneously when the first roll reduces to a predetermined diameter of paper, device for positioning the depleted first roll for replacement without the necessity of removing the second roll; and device for dispensing from the second and replacement rolls simultaneously when the second roll reduces to a predetermined diameter of paper. The apparatus also has a proximity sensor, which senses when a hand is placed near the dispenser, and thereupon dispenses a set amount of towel. The dispenser incorporates device for dissipating static charges to a local ground.

7 Claims, 23 Drawing Sheets

U.S. PATENT DOCUMENTS

| | | | |
|---|---|---|---|
| 4,172,461 A | 10/1979 | Pangburn | |
| 4,267,752 A | 5/1981 | Byrt et al. | |
| 4,358,169 A | 11/1982 | Filipowicz et al. | |
| 4,378,912 A | 4/1983 | Perrin et al. | |
| 4,464,622 A | 8/1984 | Franklin | |
| 4,569,467 A | 2/1986 | Kaminstein | |
| 4,611,768 A | 9/1986 | Voss et al. | |
| 4,666,099 A | 5/1987 | Hoffman et al. | |
| 4,721,265 A | 1/1988 | Hawkins | |
| 4,738,176 A | 4/1988 | Cassia | |
| 4,756,485 A | 7/1988 | Bastian et al. | |
| 4,786,005 A | 11/1988 | Hoffman et al. | |
| 4,790,490 A | 12/1988 | Chakravorty | |
| 4,796,825 A | 1/1989 | Hawkins | |
| 4,807,824 A | 2/1989 | Gains et al. | |
| 4,823,663 A | 4/1989 | Hamlin | |
| 4,826,262 A | 5/1989 | Hartman et al. | |
| 4,846,412 A | 7/1989 | Morand | |
| 4,960,248 A | 10/1990 | Bauer et al. | |
| 4,992,907 A * | 2/1991 | Shreeve et al. | 242/906 |
| 5,031,258 A | 7/1991 | Shaw | |
| 5,205,454 A | 4/1993 | Schutz et al. | |
| 5,217,035 A | 6/1993 | Van Marcke | |
| 5,235,882 A | 8/1993 | Rabourn | |
| 5,244,161 A | 9/1993 | Wirtz-Odenthal | |
| 5,257,711 A | 11/1993 | Wirtz-Odenthal | |
| 5,271,574 A | 12/1993 | Formon et al. | |
| 5,294,192 A | 3/1994 | Omdoll et al. | |
| 5,299,407 A | 4/1994 | Schuttler et al. | |
| 5,302,167 A | 4/1994 | Kley et al. | |
| 5,335,811 A | 8/1994 | Morand | |
| 5,365,783 A | 11/1994 | Zweifel | |
| 5,400,982 A | 3/1995 | Collins | |
| 5,452,832 A | 9/1995 | Niada | |
| 5,505,129 A | 4/1996 | Greb et al. | |
| 5,511,743 A | 4/1996 | Kozlowsky et al. | |
| 5,526,973 A | 6/1996 | Boone et al. | |
| 5,538,587 A | 7/1996 | Sakano et al. | |
| 5,553,522 A | 9/1996 | Boldrini et al. | |
| 5,558,302 A | 9/1996 | Jesperson | |
| 5,604,992 A | 2/1997 | Robinson | |
| 5,625,327 A | 4/1997 | Carroll et al. | |
| 5,630,526 A | 5/1997 | Moody | |
| 5,694,653 A | 12/1997 | Harald | |
| 5,704,566 A | 1/1998 | Schutz et al. | |
| 5,730,165 A | 3/1998 | Philipp | |
| 5,772,291 A | 6/1998 | Byrd et al. | |
| 5,806,203 A | 9/1998 | Robinson | |
| 5,823,083 A | 10/1998 | Obertegger et al. | |
| 5,833,413 A | 11/1998 | Cornelius | |
| 5,860,344 A | 1/1999 | Yamamoto et al. | |
| 5,868,343 A | 2/1999 | Granger | |
| 5,899,406 A | 5/1999 | Payne | |
| 5,915,645 A | 6/1999 | Granger | |
| 5,950,898 A | 9/1999 | Menna | |
| 5,974,764 A | 11/1999 | Anstey et al. | |
| 5,979,822 A | 11/1999 | Morand et al. | |
| 6,032,898 A | 3/2000 | LaCount et al. | |
| 6,067,673 A | 5/2000 | Paese et al. | |
| 6,069,354 A | 5/2000 | Alfano et al. | |
| 6,105,898 A | 8/2000 | Byrd et al. | |
| 6,118,469 A * | 9/2000 | Hosomi | 347/222 |
| 6,145,779 A | 11/2000 | Johnson et al. | |
| 6,152,397 A | 11/2000 | Purcell | |
| 6,279,777 B1 | 8/2001 | Goodin et al. | |
| 6,293,486 B1 | 9/2001 | Byrd et al. | |
| 6,354,533 B1 | 3/2002 | Jespersen | |
| 6,363,824 B1 | 4/2002 | Granger | 83/334 |
| 6,412,679 B2 | 7/2002 | Formon et al. | |
| 6,419,136 B2 | 7/2002 | Formon et al. | |
| 2002/0030061 A1 | 3/2002 | Formon | |
| 2002/0109034 A1 | 8/2002 | Moody et al. | |
| 2002/0109035 A1 | 8/2002 | Denen et al. | |

* cited by examiner

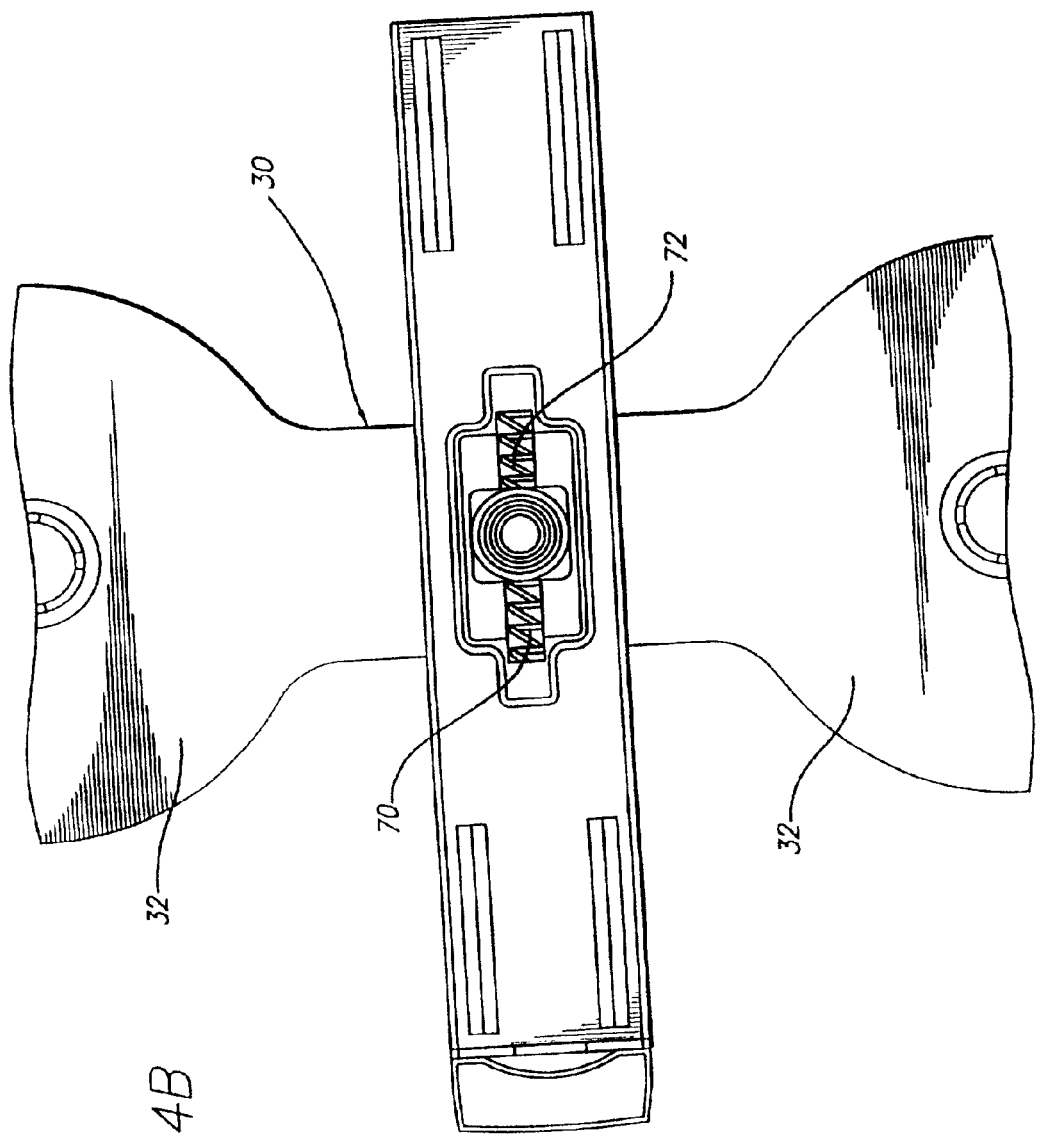

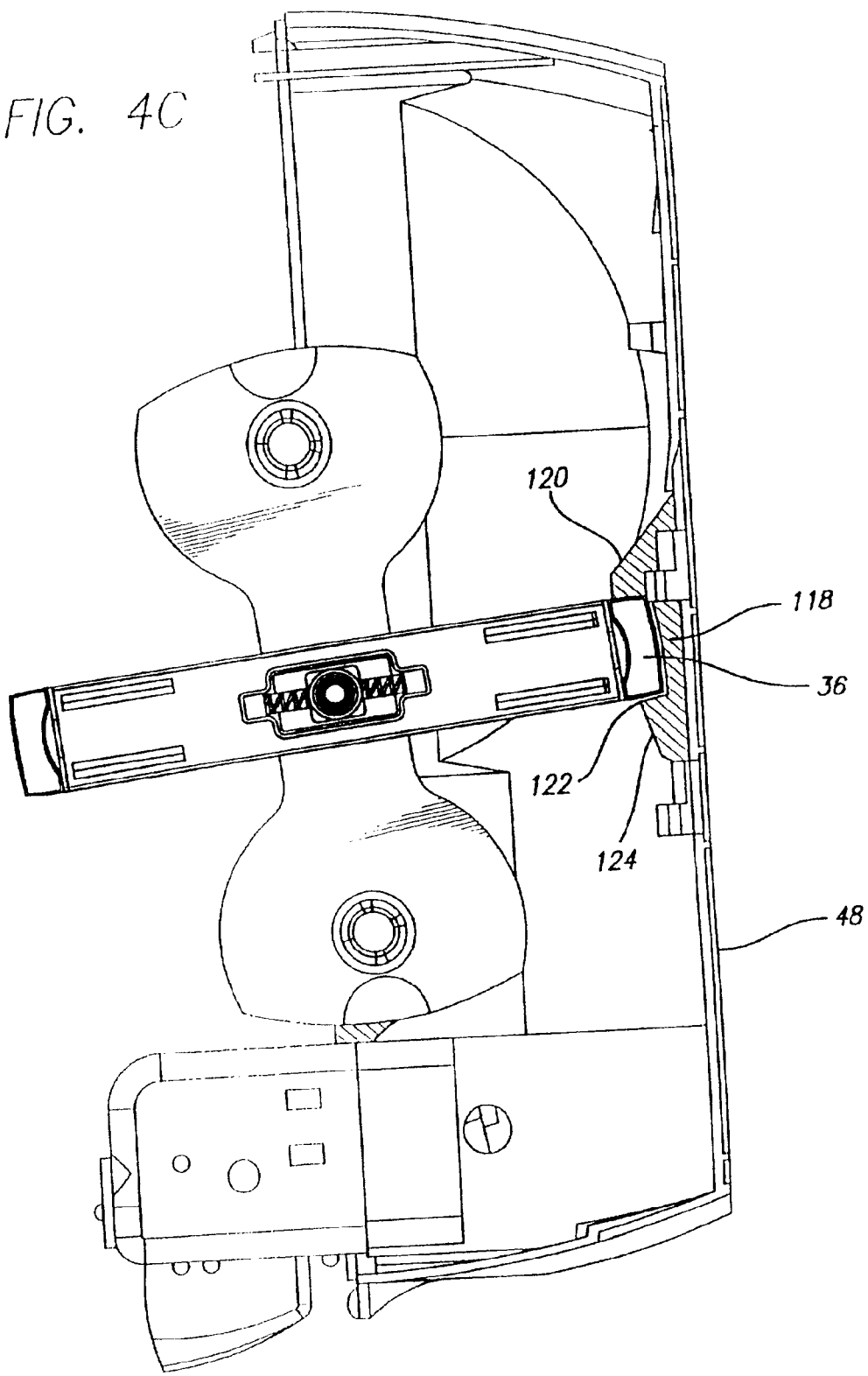

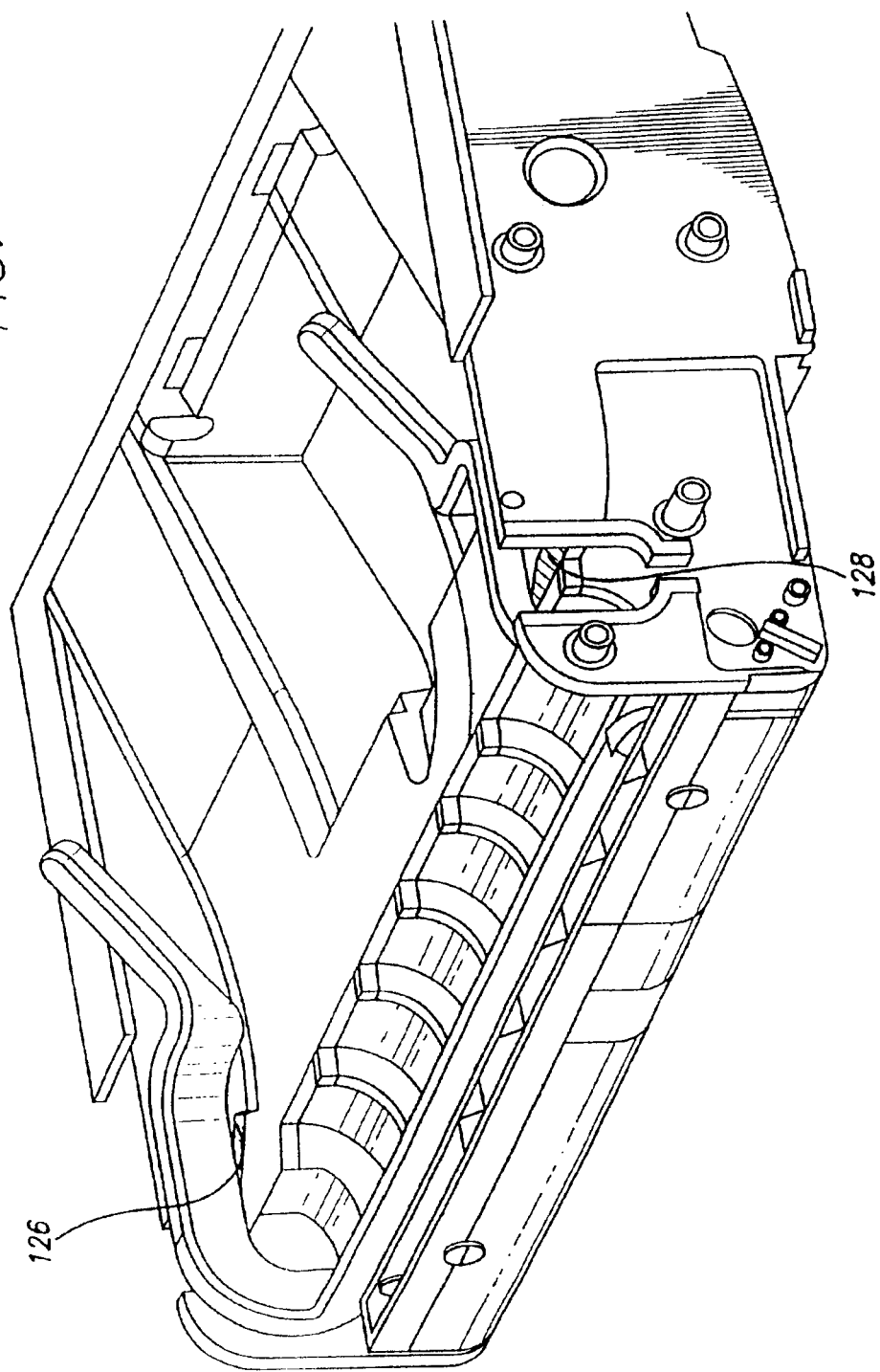

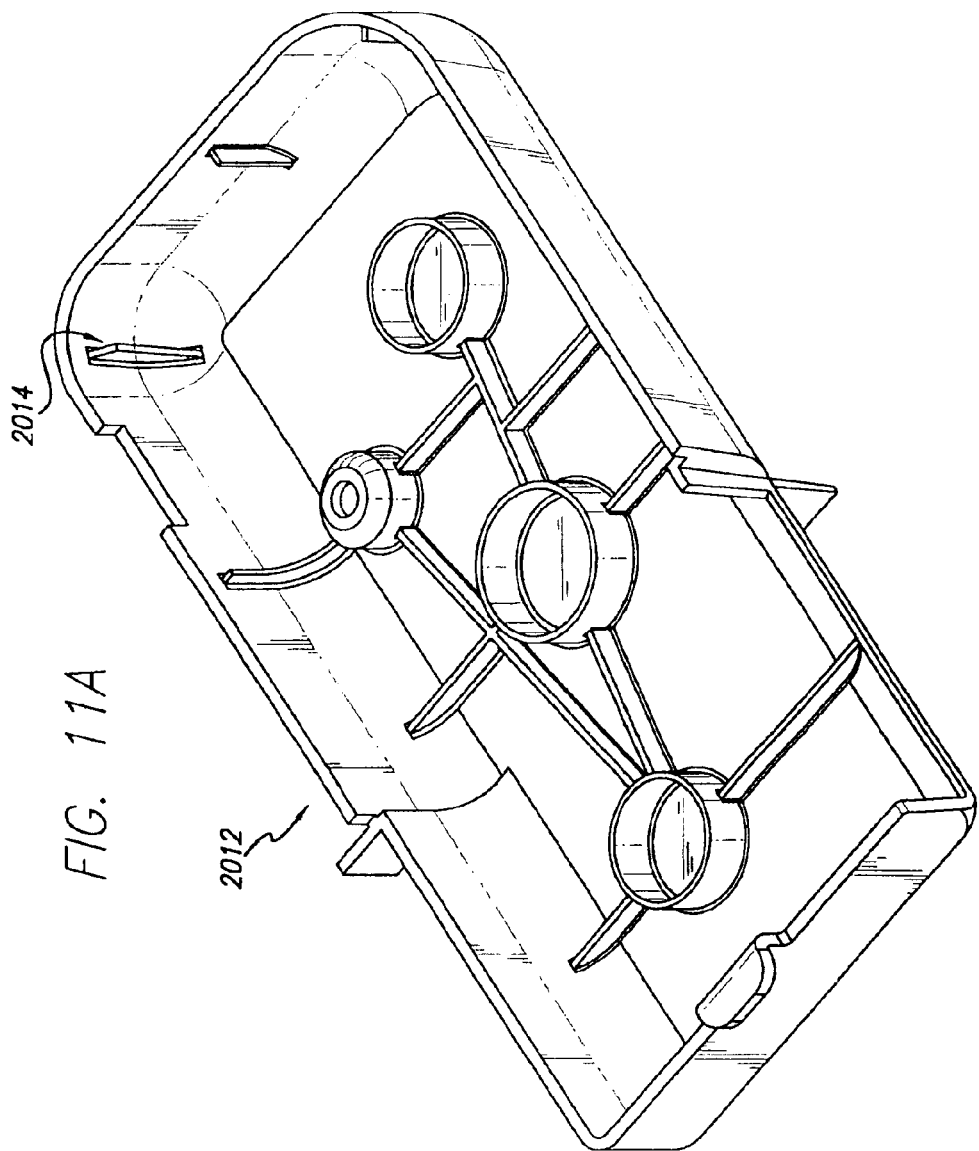

STATIC BUILD UP CONTROL IN ELECTRONIC DISPENSING SYSTEMS

This application is a Continuation-In-Part of Ser. No. 09/780,733, filed Feb. 9, 2001, U.S. Pat. No. 6,592,067.

FIELD OF THE INVENTION

This invention relates to the field of paper roll dispensers. In particular it relates to a carousel dispensing system for paper towels adapted to dispense paper from a plurality of rolls. This invention relates to the field of proximity sensors. In particular it relates to the field of phase-balance proximity sensors. It relates to grounding for static electricity buildup on the dispenser.

BACKGROUND

As is readily apparent, a long-standing problem is to keep paper towel available in a dispenser and at the same time use up each roll as completely as possible to avoid paper waste. As part of this system, one ought to keep in mind the person who refills the towel dispenser. An optimal solution would make it as easy as possible and as "fool-proof" as possible to operate the towel refill system and have it operate in such a manner as the least amount of waste of paper towel occurs. This waste may take the form of "stub" rolls of paper towel not being used up.

Transfer devices are used on some roll towel dispensers as a means of reducing waste and decreasing operating costs. These transfer devices work in a variety of ways. The more efficient of these devices automatically begin feeding from a reserve roll once the initial roll is exhausted. These devices eliminate the waste caused by a maintenance person when replacing small rolls with fresh rolls in an effort to prevent the dispenser from running out of paper. These transfer devices, however, tend to be difficult to load and/or to operate. Consequently, these transfer devices are less frequently used, even though they are present.

The current transfer bar mechanisms tend to require the maintenance person to remove any unwanted core tube(s), remove the initial partial roll from the reserve position, and position the initial partial roll into the now vacant stub roll position. This procedure is relatively long and difficult, partly because the stub roll positions in these current paper towel dispensers tend to be cramped and difficult to get to.

In order to keep a roll available in the dispenser, it is necessary to provide for a refill before the roll is used up. This factor generally requires that a "refill" be done before the current paper towel roll is used up. If the person refilling the dispenser comes too late, the paper towel roll will be used up. If the refill occurs too soon, the amount of paper towel in the almost used-up roll, the "stub" roll, will be wasted unless there is a method and a mechanism for using up the stub roll even though the dispenser has been refilled. Another issue exists, as to the ease in which the new refill roll is added to the paper towel dispenser. The goal is to bring "on-stream" the new refill roll as the last of the stub roll towel is being used up. If it is a task easily done by the person replenishing the dispensers, then a higher probability exists that the stub roll paper towel will actually be used up and also that a refill roll be placed into service before the stub roll has entirely been used up. It would be extremely desirable to have a paper towel dispenser which tended to minimize paper wastage by operating in a nearly "fool proof" manner with respect to refilling and using up the stub roll.

As an enhancement and further development of a system for delivering paper towel to the end user in as cost effective manner and in a user-friendly manner as possible, an automatic means for dispensing the paper towel is desirable, making it unnecessary for a user to physically touch a knob or a lever.

It has long been known that the insertion of an object with a dielectric constant into a volume with an electrostatic field will tend to modify the properties which the electrostatic field sees. For example, sometimes it is noticed that placing one hand near some radios will change the tuning of that radio. In these cases, the property of the hand, a dielectric constant close to that of water, is enough to alter the net capacitance of a tuned circuit within the radio, where that circuit affects the tuning of the RF signal being demodulated by that radio. In 1973 Riechmann (U.S. Pat. No. 3,743,865) described a circuit which used two antenna structures to detect an intrusion in the effective space of the antennae. Frequency and amplitude of a relaxation oscillator were affected by affecting the value of its timing capacitor.

The capacity (C) is defined as the charge (Q) stored on separated conductors with a voltage (V) difference between the conductors:

$$C=Q/V.$$

For two infinite conductive planes with a charge per unit area of σ, a separation of d, with a dielectric constant ∈ of the material between the infinite conductors, the capacitance of an area A is given by:

$$C=\in A\sigma/d$$

Thus, where part of the separating material has a dielectric constant $\in_1$ and part of the material has the dielectric constant $\in_2$, the net capacity is:

$$C=\in_1 A_1\sigma/d+\in_2 A_2\sigma/d$$

The human body is about 70% water. The dielectric constant of water is $7.18\times10^{-10}$ farads/meter compared to the dielectric constant of air (STP): $8.85\times10^{-12}$ farads/meter. The dielectric constant of water is over 80 times the dielectric constant of air. For a hand thrust into one part of space between the capacitor plates, occupying, for example, a hundredth of a detection region between large, but finite parallel conducting plates, a desirable detection ability in terms of the change in capacity is about $10^{-4}$. About $10^{-2}$ is contributed by the difference in the dielectric constants and about $10^{-2}$ is contributed by the "area" difference.

Besides Riechmann (1973), other circuits have been used for, or could be used for proximity sensing.

An important aspect of a proximity detector circuit of this type is that it be inexpensive, reliable, and easy to manufacture. A circuit made of a few parts tends to help with reliability, cost and ease of manufacture. Another desirable characteristic for electronic circuits of this type is that they have a high degree of noise immunity, i.e., they work well in an environment where there may be electromagnetic noise and interference. Consequently a more noise-immune circuit will perform better and it will have acceptable performance in more areas of application.

The presence of static electric charges on a surface, which is in proximity to electronic systems, creates a vulnerability to the presence of such charges and fields. Various approaches to grounding the surfaces are used to provide a pathway for the static electric charges to leave that surface. Since static electric charges may build up from one or two kilovolts to 30 or more kilovolts in a paper-towel-dispensing machine, the deleterious effect on electronic components can be very real. An approach involves using an existing ground such as an AC ground "green wire" in a three-wire 110-volt system. The grounding is achieved by attaching to the ground wire or conduit. The grounding wire is ultimately connected to an earth ground. This approach is widely used in the past and is well known. However, many locations where a motorized paper towel dispenser might be located do not have an existing AC system with ground.

In cases where grounded receptacles are not present, a ground may be produced by driving a long metal rod, or rods, into the earth. Another method for grounding utilizes a cold water pipe, which enters and runs underground. Roberts (U.S. Pat. No. 4,885,428) shows a method of grounding which includes electrical grounding receptacles and insulated ground wire connected to a single grounding point, viz., a grounding rod sunk into the earth. This method of Roberts avoids grounding potential differences. Otherwise grounding each grounding receptacle to a separate grounding rod likely finds in-ground variation of potential. Soil conditions such as moisture content, electrolyte composition and metal content are factors that can cause these local variations in grounding potential. The cost and inconvenience of installing a grounding rod system may be prohibitive to support an installation of a motorized paper towel dispenser.

However, in many instances it may not be possible to have either of these approaches available. Therefore, a desirable grounding approach would be to ground to a local surface, termed a local ground, which may be a high impedance object, which is only remotely connected to an earth ground. In particular, dispensing paper towels, and other materials, can produce static electric build up charge during the dispensing cycle. In the past the static electricity build up, when it was produced on a lever crank or pulled-and-tear type systems paper towel dispensers, had little or no effect on the performance of the dispensing system. The most that might happen would be the user receiving a "static-electric shock." Although unpleasant this static electric shock is not injurious to the person or to the towel dispenser.

Today, however, dispensing systems are often equipped with batteries. These batteries may operate a dispensing motor. However, in addition there may other electronic circuitry present, for example, a proximity sensing circuit might utilize low power CMOS integrated circuits. These CMOS integrated circuits are particularly vulnerable to static electric charge build up. It is desirable to protect these electronic from the static electric discharge.

In analyzing the static charge build up one may look at the charge separation occurring during a ripping operation of the towel or from the action of the paper on rollers or other items in the dispensing pathway.

A ground may be regarded as a sink of charge. This sink may be large as in the case of an actual earth ground. On the other hand, this grounding may relate to a relatively smaller sink of charge, a local ground. The sink of charge may be a wall or a floor or a part of such objects. The static charge build up may be in one sense regarded as a charge in a capacitor separated from a ground (as the second surface of the capacitor) by a high impedance material. The charge can't reach an earth ground as the wall material does not conduct electricity well.

There is, however, another mode of dispersing the charge on the surface. The isolated charges are of the same sign. The charges tend to repel each other. Therefore, the tendency is to spread out on the surface. Where the surface is completely dry and of a non-conductive material, then the actual conduction is very low. The motion of the charges, whether electrons or positive or negative ions, may be impeded by surface tension (Van der Waal) forces between the charges (electrons, negative ions or positive ions). Therefore, in the case where the surface is somewhat damp, even at a low 5% to 10% relative humidity, it is likely that various impurities are present in the water so as to form a weak, conducting electrolyte solution. At higher humidity this provides for an even more efficient way of dispersing the charges on the surface.

SUMMARY OF THE INVENTION

The invention comprises to a carousel-based dispensing system for paper towels, in particular, which acts to minimize actual wastage of paper towels. The invention comprises means for holding and positioning at least first and second rolls of paper with respect to each other, means for dispensing paper from the first roll, means for dispensing paper from the first and second rolls simultaneously when the first roll reduces to a predetermined diameter of paper, means for positioning the depleted first roll for replacement without the necessity of removing the second roll and means for dispensing from the second and replacement rolls simultaneously when the second roll reduces to a predetermined diameter of paper.

A proximity sensor embodiment comprises a circuit according to a balanced bridge principle where detection is based on detecting a phase difference, which depends upon the amount of detected capacitance difference or change of capacitance in a region of detection.

This invention comprises a method, apparatus and system for grounding static electrical build up on paper towel dispensers to a high impedance local electrical ground. This invention utilizes a high conductivity pathway to interconnect any internal components subject to static electric build up. This high-conductivity, low-impedance internal ground leads to an electrical mechanical contact on the outside of the dispenser. A metal contact between the high conductivity pathway and for example, the wall against which the dispenser is mounted provides an electrical-mechanical contact for the dissipation of the static electrical build up on the dispenser by way of a high impedance local electrical ground such as the wall.

BRIEF DESCRIPTION OF THE DRAWINGS

For a more complete understanding of the present invention, and the advantages thereof, reference is now made to the following descriptions taken in conjunction with the accompanying drawings, in which:

FIG. 4B is a side view of the locking bar showing the placement of the compression springs;

FIG. 4C shows the locking mechanism where the locking bar closest to the rear of the casing is adapted to fit into a mating structure in the rear casing;

FIG. 7C shows the location of the extension springs which tend to maintain the transfer bar legs in contact with the stub roll;

FIG. 11A is a perspective view of the gear cover with a molded rib that holds the spring contact in place;

DETAILED DESCRIPTION OF THE PREFERRED EMBODIMENT

The following description is of the best mode presently contemplated for carrying out the invention. This description is not to be taken in a limiting sense, but is merely made for the purpose of describing the general principles of the invention. The scope of the invention should be determined with reference to the claims.

An embodiment of the invention comprises a carousel-based dispensing system with a transfer bar for paper towels, which acts to minimize actual wastage of paper towels. As an enhancement and further development of a system for delivering paper towel to the end user in a cost effective manner and in as user-friendly manner as possible, an automatic means for dispensing the paper towel is desirable, making it unnecessary for a user to physically touch a knob or a lever. An electronic proximity sensor is included as part of the paper towel dispenser. A person can approach the paper towel dispenser, extend his or her hand, and have the proximity sensor detect the presence of the hand. The embodiment of the invention as shown here, is a system, which advantageously uses a minimal number of parts for both the mechanical structure and for the electronic unit. It has, therefore, an enhanced reliability and maintainability, both of which contribute to cost effectiveness.

An embodiment of the invention comprises a carousel-based dispensing system with a transfer bar for paper towels, which acts to minimize actual wastage of paper towels. The transfer bar coupled with the carousel system is easy to load by a service person; consequently it will tend to be used, allowing stub rolls to be fully utilized. In summary, the carousel assembly-transfer bar comprises two components, a carousel assembly and a transfer bar. The carousel rotates a used-up stub roll to an up position where it can easily be replaced with a full roll. At the same time the former main roll which has been used up such that its diameter is less than some p inches, where p is a rational number, is rotated down into the stub roll position. The tail of the new main roll in the upper position is tucked under the "bar" part of the transfer bar. As the stub roll is used up, the transfer bar moves down under spring loading until the tail of the main roll is engaged between the feed roller and the nib roller. The carousel assembly is symmetrical about a horizontal axis. A locking bar is pulled out to unlock the carousel assembly and allow it to rotate about its axis, and is then released under its spring loading to again lock the carousel assembly in place.

Figure 1:
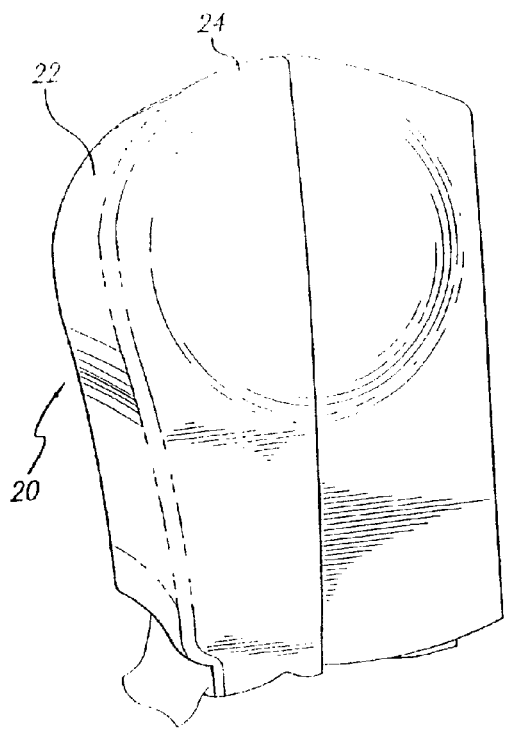
FIG. 1 is a side elevation of the dispenser with the cover closed, with no internal mechanisms visible.
Figure 2:
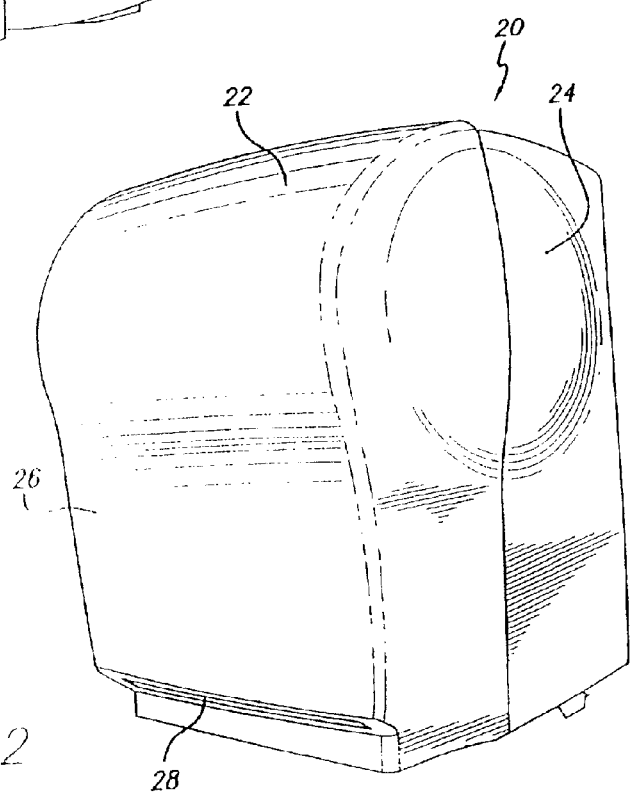
FIG. 2 is a perspective view of the dispenser with the cover closed, with no internal mechanisms visible.

A side view, FIG. 1, of the dispenser 20 with the cover 22 in place shows an upper circular bulge 24, providing room for a full roll of paper towel, installed in the upper position of the carousel. The shape of the dispenser is such that the front cover tapers inwardly towards the bottom to provide a smaller dispenser volume at the bottom where there is a smaller stub roll of paper towel. The shape tends to minimize the overall size of the dispenser. FIG. 2 shows a perspective view of the dispenser 20 with cover 22 in place and the circular (cylindrical) bulge 24, together with the sunrise-like setback 26 on the cover 22, which tends to visually guide a hand toward the pseudo-button 28, leading to activation of a proximity sensor (not shown). A light emitting diode (LED) 130 is located centrally to the pseudo-button 28. The LED 130 (FIG. 3) serves as an indication that the dispenser 20 is on, and dispensing towel. The LED 130 may be off while the dispenser is not dispensing. Alternatively, the LED 130 may be lit (on), and when the dispenser 20 is operating, the LED 130 might flash. The LED 130 might show green when the dispenser 20 is ready to dispense, and flashing green, or orange, when the dispenser 20 is operating to dispense. Any similar combination may be used. The least power consumption occurs when the LED 130 only lights during a dispensing duty cycle. The sunrise-like setback 26 (FIG. 2) allows a hand to come more closely to the proximity sensor (not shown).

Figure 3:
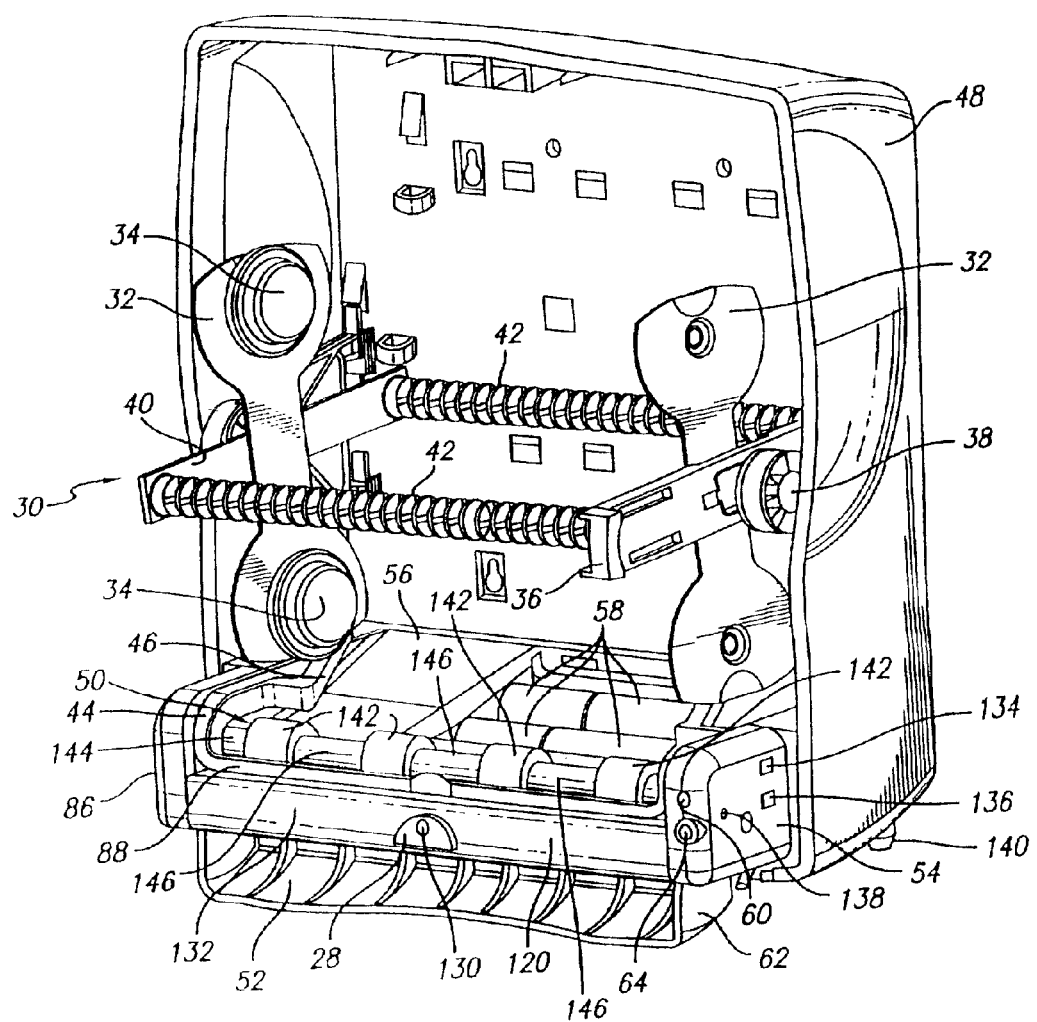
FIG. 3 shows a view of the carousel support, the locking bar and the transfer bar.

FIG. 3 shows the main elements of the carousel assembly 30. The carousel arms 32 have friction reducing rotating paper towel roll hubs 34, which are disposed into the holes of a paper towel roll (66, 68, FIG. 4A). The locking bar 36 serves to lock and to release the carousel for rotation about its axis 38. The locking bar 36 rides on one of the corresponding bars 40. The two corresponding bars 40 serve as support bars. Cross-members 42 serve as stiffeners for the carousel assembly 30, and also serve as paper guides for the paper to be drawn over and down to the feed roller 50 and out the dispenser 20. These cross members are attached in a rigid fashion to the corresponding bars 40 and in this embodiment do not rotate.

The legs 46 of the transfer bar 44 do not rest against the friction reducing rotating paper towel roll hubs 34 when there is no stub roll 68 present but are disposed inward of the roll hubs 34. The bar part 88 of the transfer bar 44 will rest against a structure of the dispenser, for example, the top of modular electronics unit 132, when no stub roll 68 is present. The bar part 88 of the transfer bar 44 acts to bring the tail of a new main roll of paper towel 66 (FIG. 4A) down to the feed roller 50 which includes intermediate bosses 146 (FIG. 3) and shaft 144. The carousel assembly is disposed within the fixed casing 48. The cover is not shown.

Feed roller 50 serves to feed the paper towels 66, 68 (FIG. 4A) being dispensed onto the curved dispensing ribs 52. The curved dispensing ribs 52 are curved and have a low area of contact with the paper towel dispensed (not shown). If the dispenser 20 gets wet, the curved dispensing ribs 46 help in dispensing the paper towel to get dispensed by providing low friction and by holding the dispensing towel off of the wet surfaces it would otherwise contact.

The feed roller 50 is typically as wide as the paper roll, and includes drive rollers 142 and intermediate bosses 146 on the drive shaft 144. The working drive rollers or drive bosses 142 (FIG. 3) are typically an inch or less in width, with intermediate bosses 146 (FIG. 3) located between them. Intermediate bosses 146 are slightly less in diameter than the drive rollers or drive bosses 142, having a diameter 0.015 to 0.045 inches less than the drive rollers or drive bosses 142. In this embodiment, the diameter of the intermediate bosses 146 is 0.030 inches less than the drive roller 142. This configuration of drive rollers or drive bosses 142 and intermediate bosses 146 tends to prevent the dispensing paper towel from becoming wrinkled as it passes through the drive mechanism and reduces friction, requiring less power to operate the feed roller 50.

A control unit 54 operates a motor 56. Batteries 58 supply power to the motor 56. A motor 56 may be positioned next to the batteries 58. A light 60, for example, a light-emitting diode (LED), may be incorporated into a low battery warning such that the light 60 turns on when the battery voltage is lower than a predetermined level.

The cover 22 of the dispenser is preferably transparent so that the amount of the main roll used (see below) may be inspected, but also so that the battery low light 60 may easily be seen. Otherwise an individual window on an opaque cover 22 would need to be provided to view the low battery light 60. Another approach might be to lead out the light by way of a fiber optic light pipe to a transparent window in the cover 22.

In a waterproof version of the dispenser, a thin piece of foam rubber rope is disposed within a u-shaped groove of the tongue-in-groove mating surfaces of the cover 22 and the casing 48. The dispensing shelf 62 is a modular component, which is removable from the dispenser 20. In the waterproof version of the dispenser 20, the dispensing shelf 62 with the molded turning ribs 52 is removed. By removing the modular component, dispensing shelf 62, there is less likelihood of water being diverted into the dispenser 20 by the dispensing shelf 62, acting as a funnel or chute should a water hose or spray be directed at the dispenser 20, by the shelf and wetting the paper towel. The paper towel is dispensed straight downward. A most likely need for a waterproof version of the dispenser is where a dispenser is located in an area subject to being cleaned by being hosed down. The dispenser 20 has an on-off switch which goes to an off state when the cover 22 is pivoted downwardly. The actual switch is located on the lower face of the nodule 54 and is not shown.

In one embodiment, the user may actuate the dispensing of a paper towel by placing a hand in the dispenser's field of sensitivity. There can be adjustable delay lengths between activations of the sensor.

There is another aspect of the presence of water on or near the dispenser 20. A proximity sensor (not visible) is more fully discussed below, including the details of its operation. However, as can be appreciated, the sensor detects changes of capacitance such as are caused by the introduction of an object with a high dielectric constant relative to air, such as water, as well as a hand which is about 70% water. An on-off switch 140 is provided which may be turned off before hosing down and may be turned on manually, afterwards. The switch 140 may also work such that it turns itself back on after a period of time, automatically. The switch 140 may operate in both modes, according to mode(s) chosen by the user.

A separate "jog" off-on switch 64 is provided so that a maintenance person can thread the paper towel 66 by holding a spring loaded jog switch 64 which provides a temporary movement of the feed roller 50.

Figure 4A:
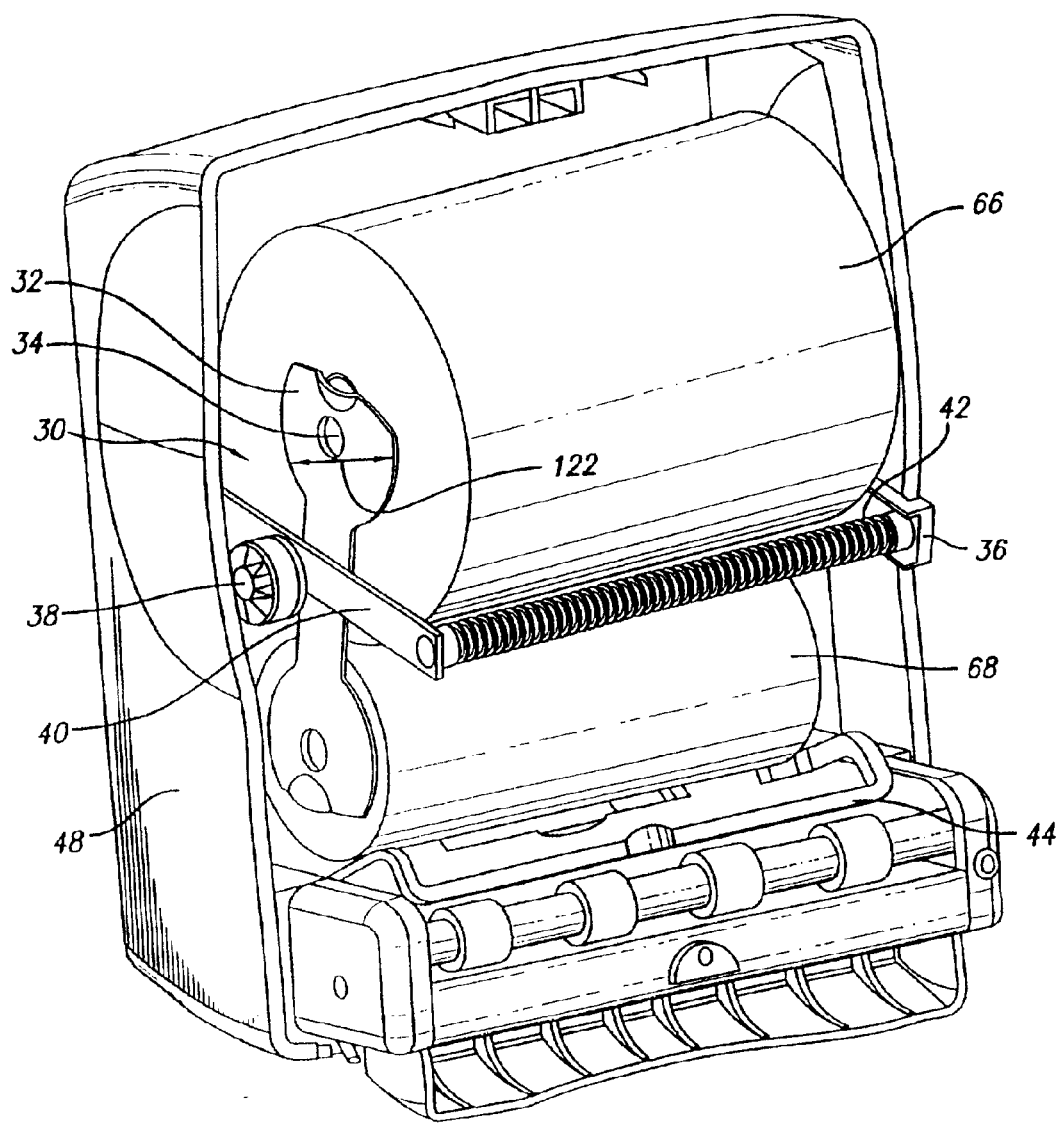
FIG. 4A is a perspective view of the of the dispenser with the carousel and transfer bar, fully loaded with a main roll and a stub roll.

FIG. 4A shows the dispenser case 48 with the carousel assembly 30 and transfer bar 44. The carousel assembly 30 is fully loaded with a main roll 66 and a stub roll 68, both mounted on the carousel arms 32 and rotate on the rotating reduced friction paper towel roll hubs 34 (only shown from the back of the carousel arms 32). In the carousel assembly 30, the two carousel arms 32, joined by corresponding bars 40 and cross members 42, rotate in carousel fashion about a horizontal axis defined by the carousel assembly rotation hubs 38. The locking bar 36 is supported, or carried, by a corresponding bar 40. The corresponding bar 40 provides structural rigidity and support. The locking bar 36 principally serves as a locking mechanism. Each paper towel roll 66, 68 has an inner cardboard tube which acts as a central winding core element, and which provides in a hole in paper towel roll 66, 68 at each end for engaging the hubs 34.

Figure 5:
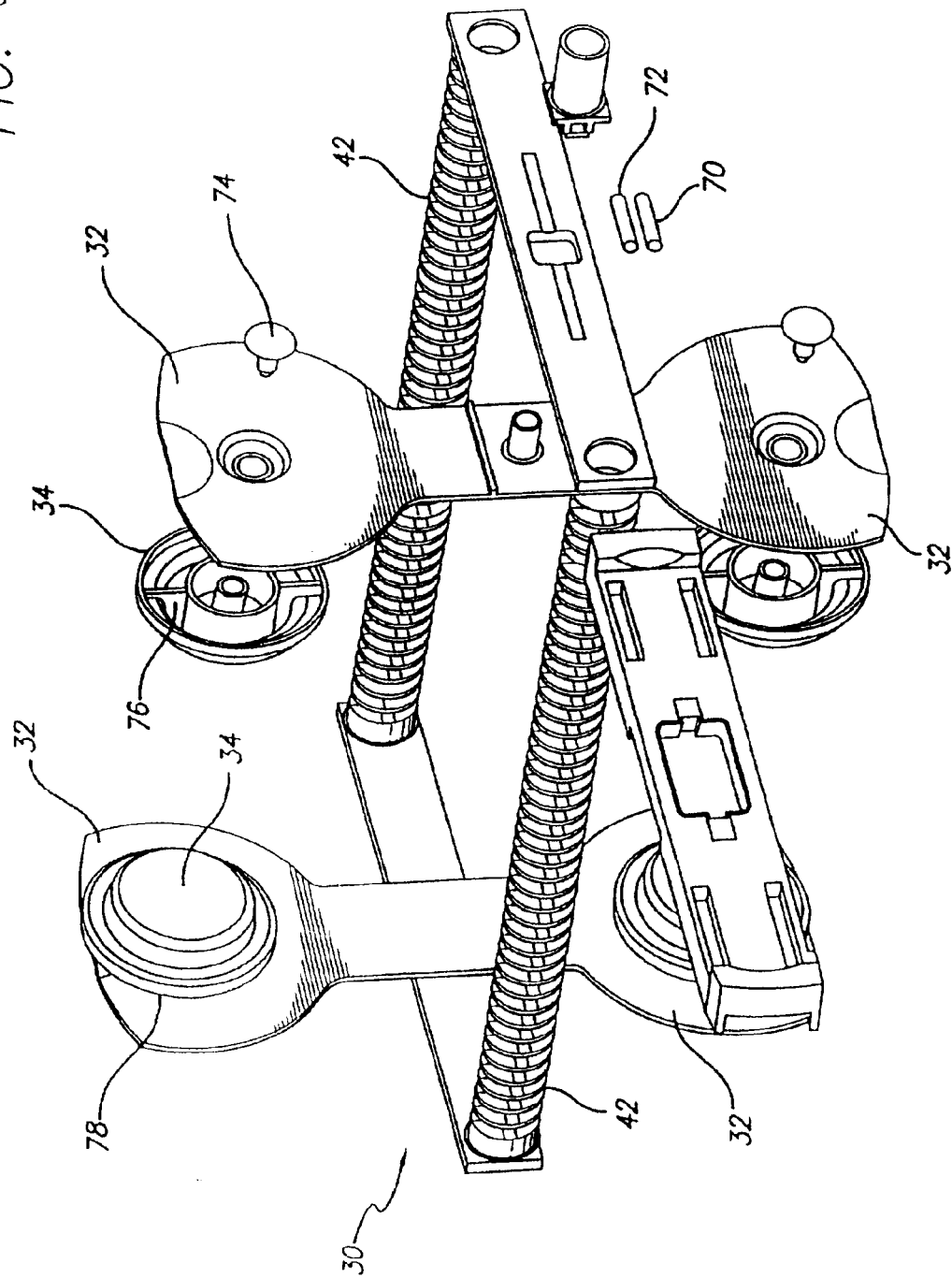
FIG. 5 is a perspective, exploded view of the carousel assembly.

FIG. 5 shows the carousel assembly 30 in exploded, perspective view. The number of parts comprising this assembly is small. From a reliability point of view, the reliability is increased. From a manufacturing point of view, the ease of manufacture is thereby increased and the cost of manufacture is reduced. The material of manufacture is not limited except as to the requirements of cost, ease of manufacture, reliability, strength and other requirements imposed by the maker, demand.

When the main roll, 66 (FIG. 4A) and the stub roll 68, (FIG. 4A) are in place, the carousel arms 32 are connected by these rolls 66 and 68 (FIG. 4A). Placing cross-members 42 to connect the carousel arms 32 with the locking 36 and corresponding 40 bar results in better structural stability, with racking prevented. The locking bar 36, which was shown as a single unit locking bar 36 in the previous figures, acts as a locking bar 36 to lock the carousel assembly 30 in the proper orientation. It acts also as the release bar, which when released, allows the carousel assembly 30 to rotate. Two compression springs 70, 72 are utilized to center the locking bar 36.

FIG. 4B is a side view of the locking bar showing the placement of the compression springs. The compression springs 70, 72 also tend to resist the release of the locking bar 36, insuring that a required force is needed to unlock the locking bar 36. The required force is typically between 0.5 lbf and 3.0 lbf, or more. In this embodiment, the force is 2.0 lbf when the spring in a fully compressed position, and 1.1 lbf when the spring is in the rest position. In the rest position, the forces of the opposing springs offset each other.

The actual locking occurs as shown in FIG. 4C. The locking bar 36 closest to the rear of the casing 48 is adapted to fit into a generally u-shaped mating structure 118 which is adapted to hold the locking bar 36 and prevent it and the carousel assembly 30 from rotating. When the locking bar 36 is pulled away from the rear of the casing 48, the locking bar 36 is disengaged from the mating structure 118. The mating structure has an upper "high" side 120 and a lower "low" side 122, where the low side has a "ramp" 124 on its lower side. As the locking bar 36 is pulled out to clear the high side 120, the carousel assembly 30 is free to rotate such that the top of the carousel assembly 30 rotates up and away from the back of the casing 48. As the carousel assembly 30 begins to rotate, the user releases the locking bar 36 which, under the influence of symmetrically placed compression springs 70, 72 returns to its rest position. As the carousel assembly rotates, the end of the symmetrical locking bar 36 which originally was disposed toward the user now rotates and contacts the ramp 124. A locking bar spring, e.g., 70 or 72, is compressed as the end of the locking bar 36 contacting the ramp 124 now moves up the ramp 124. The end of the locking bar 36 is pressed into the space between the low side 122 and the high side 120, as the end of the locking bar 36 slides past the low side 122. A locked position for the carousel assembly 30 is now reestablished.

FIG. 5 shows the carousel arms 32 adapted to receive the loading of a new roll of towel 66 (FIG. 4A). The arms 32 are slightly flexible and bent outward a small amount when inserting a paper towel roll 66 (FIG. 4A) between two opposite carousel arms 32. A friction reducing rotating paper towel roll hub 34 is inserted into a hole of a paper towel roll 66 (FIG. 4A), such that one roll hub 34 is inserted into a hole on each side of the paper towel roll 66 (FIG. 4A). Also shown in FIG. 5 are the tamper resistant fasteners 74, which attach the friction-reducing rotating paper towel roll hubs 34 to the carousel arms 32.

FIG. 5 shows the surface 76 of the roll hubs 34 and the surface 78 of the carousel arms 66, which contact each other. These contact surfaces 76, 78 may be made of a more frictionless material than that of which the carousel arms 32 and the roll hubs 34 are made. For example, a plastic such as polytetrafluoroethylene (PTFE), e.g., TEFLON®, may be used, as a thin layer on each of the contacting surfaces. The paper towel dispenser 20 and its components may be made of, including but not limited to, plastic, metal, an organic material which may include but is not limited to wood, cardboard, treated or untreated, a combination of these materials, and other materials for batteries, paint, if any, and waterproofing.

Figure 6A:
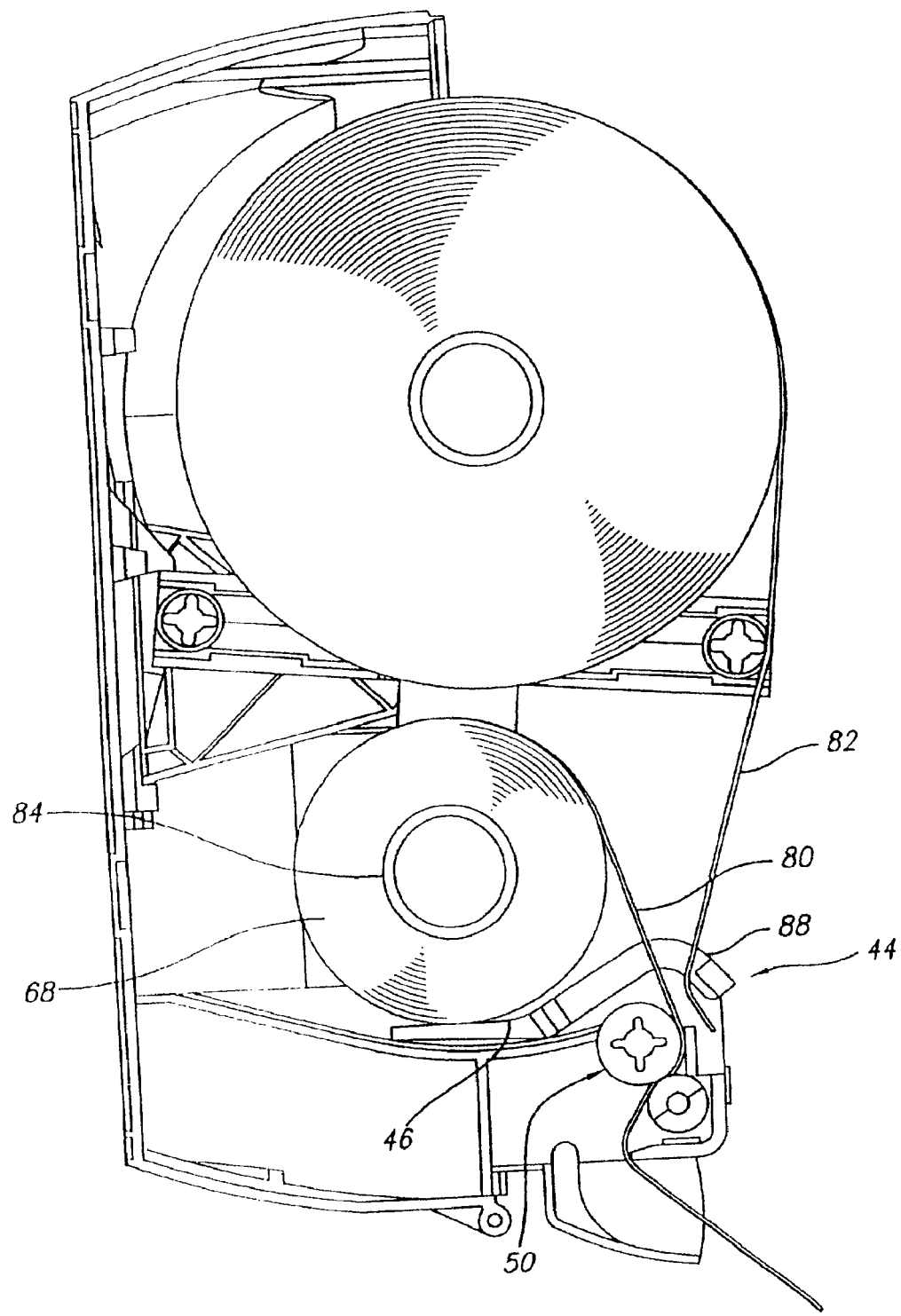
FIG. 6A is a side elevation view of the paper feeding from the stub roll while the tail of the main roll is positioned beneath the transfer bar.

FIG. 6A shows the paper 80 feeding from the stub roll 68 while the tail 82 of the main roll 66 is positioned beneath the transfer bar 44. The legs (visible leg 46, other leg not shown) of the transfer bar 44 rests against the stub roll. When the diameter of the stub roll 68 is larger by a number of winds of paper towel than the inner roll 84, the legs 46 of the transfer bar 44 dispose the bar 88 of the transfer bar 44 to be rotated upward from the feed roller 50.

Figure 6B:
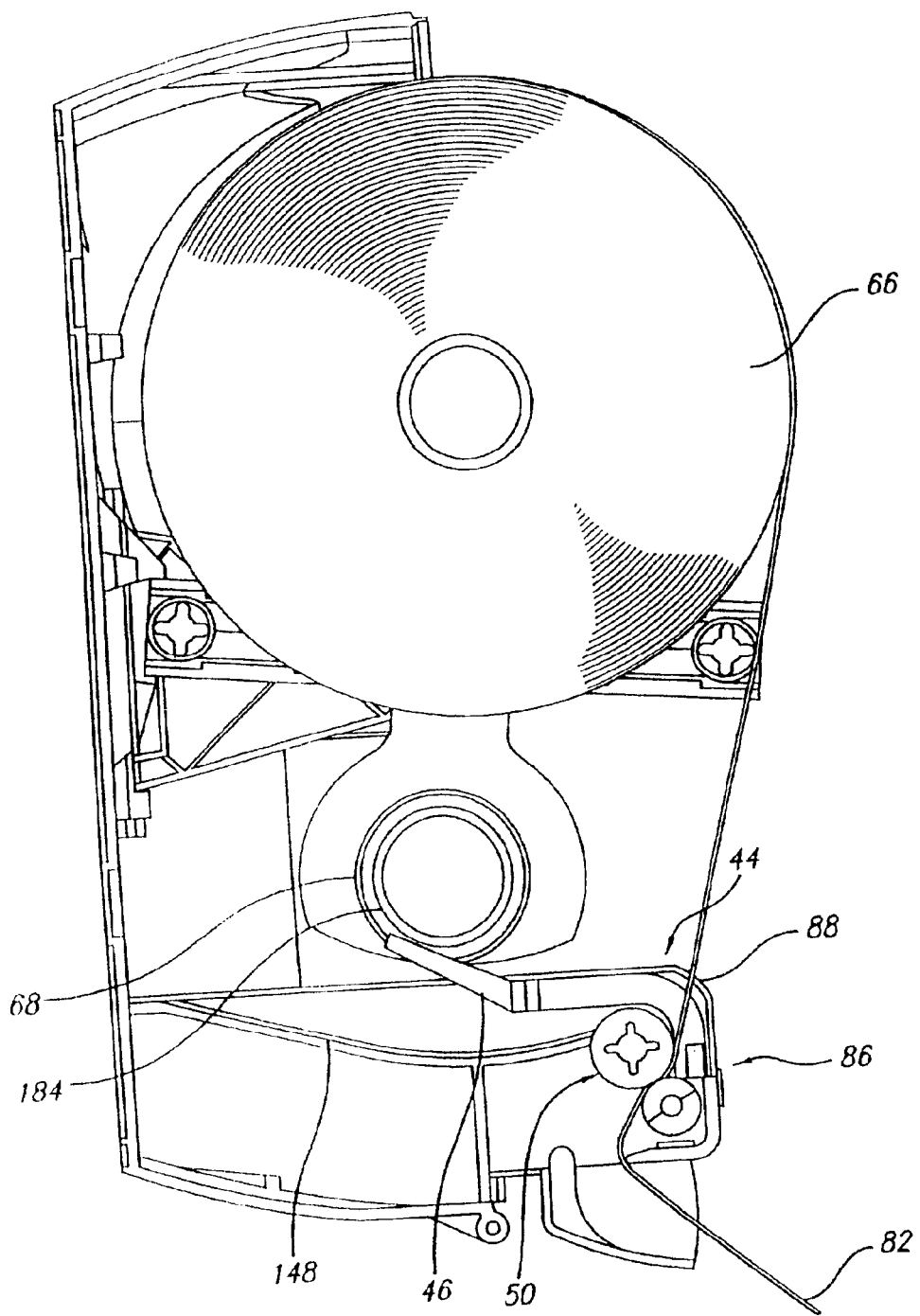
FIG. 6B is a side elevation view of the stub roll is completely exhausted, so that the transfer bar tucks the tail of the main roll into the feed mechanism.

FIG. 6B shows the situation where the stub roll 68 is exhausted, so that the transfer bar 44 tucks the tail 82 of the main roll 66 into the feed mechanism 86. FIG. 6B shows the stub roll 68 position empty, as the stub roll has been used up. The stub roll core 84 is still in place. As the stub roll 68 is used up, the legs 46 of the transfer bar 44 move up toward the stub roll core (inner roll) 84, and the bar 88 of the transfer bar is disposed downward toward the feed roller 50 and toward the top of a structural unit of the dispenser 20 (FIG. 2), such as the top of the electronics module 132 (FIG. 3). Initially the main roll 66 is in reserve, and its tail 82 in an "idling" position such that it is under the transfer bar 44. The main roll 66 and its tail 82 are not initially in a "drive" position. However, as the stub roll 68 is used up, the downward motion of the bar transfer bar, 44 driven by its spring loading, brings the bar 88 of the transfer bar 44 down to engage the main roll tail 82 with the feed roller 50.

Figure 7A:
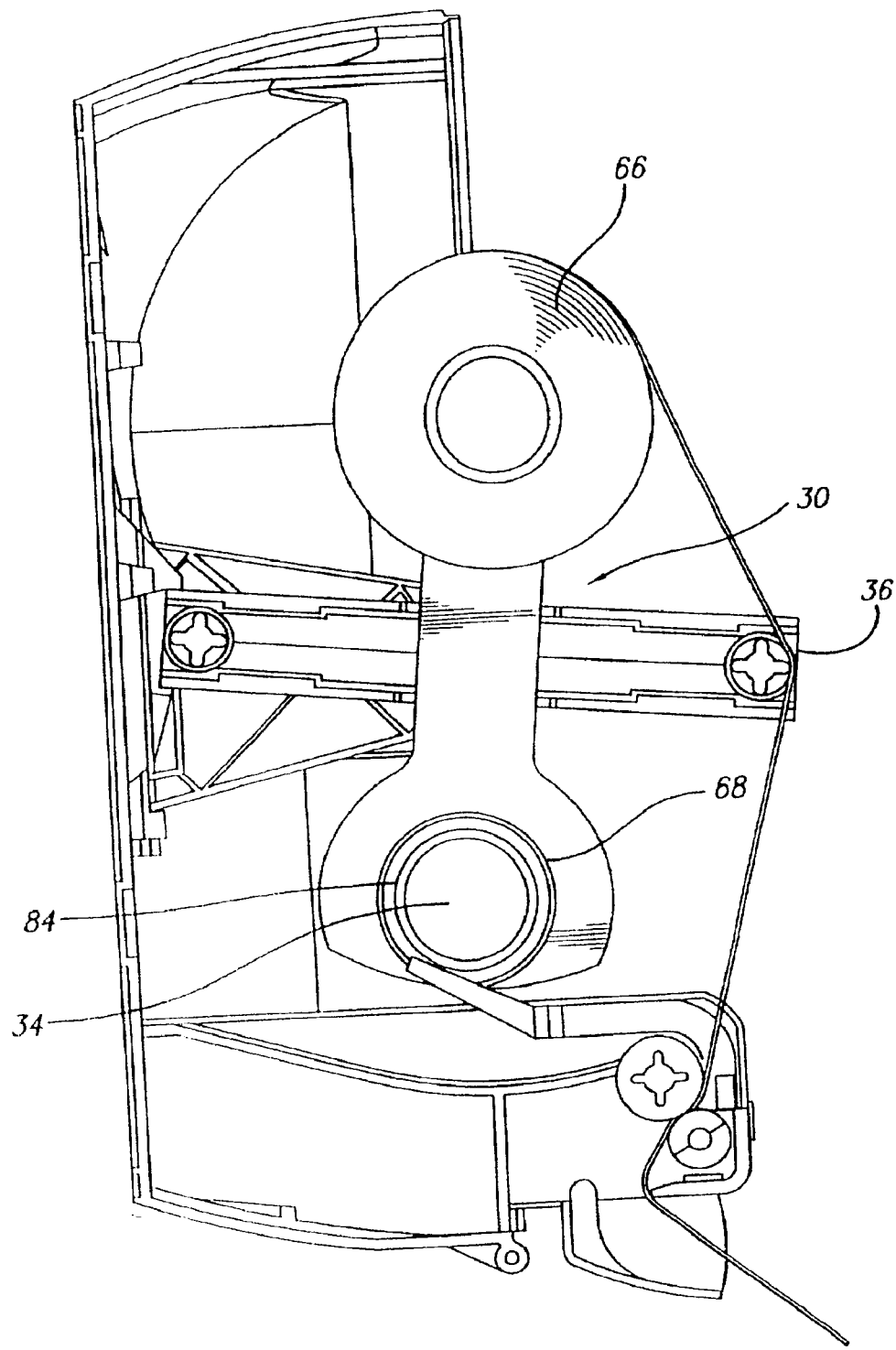
FIG. 7A is a side elevation view of the carousel ready for loading when the main roll reaches a specific diameter.

FIG. 7A shows the carousel assembly 30 ready for loading when the main roll 66 reaches a specific diameter. The diameter of the main roll 66 may be measured by comparison of that diameter with the widened "ear" shape 122 (FIG. 4A) on each end of the carousel arms 32. That part of each carousel arm 32 is made to measure a critical diameter of a main roll 66. The carousel assembly 30 is tilted forward when it is locked. The carousel assembly 30 may rotate unassisted after the locking bar 36 is released, due to the top-heavy nature of the top roll. That is, the torque produced by the gravitational pull on the main-roll 66 is larger than that needed to overcome friction and the counter-torque produced by the now empty stub roll 68.

Figure 7B:
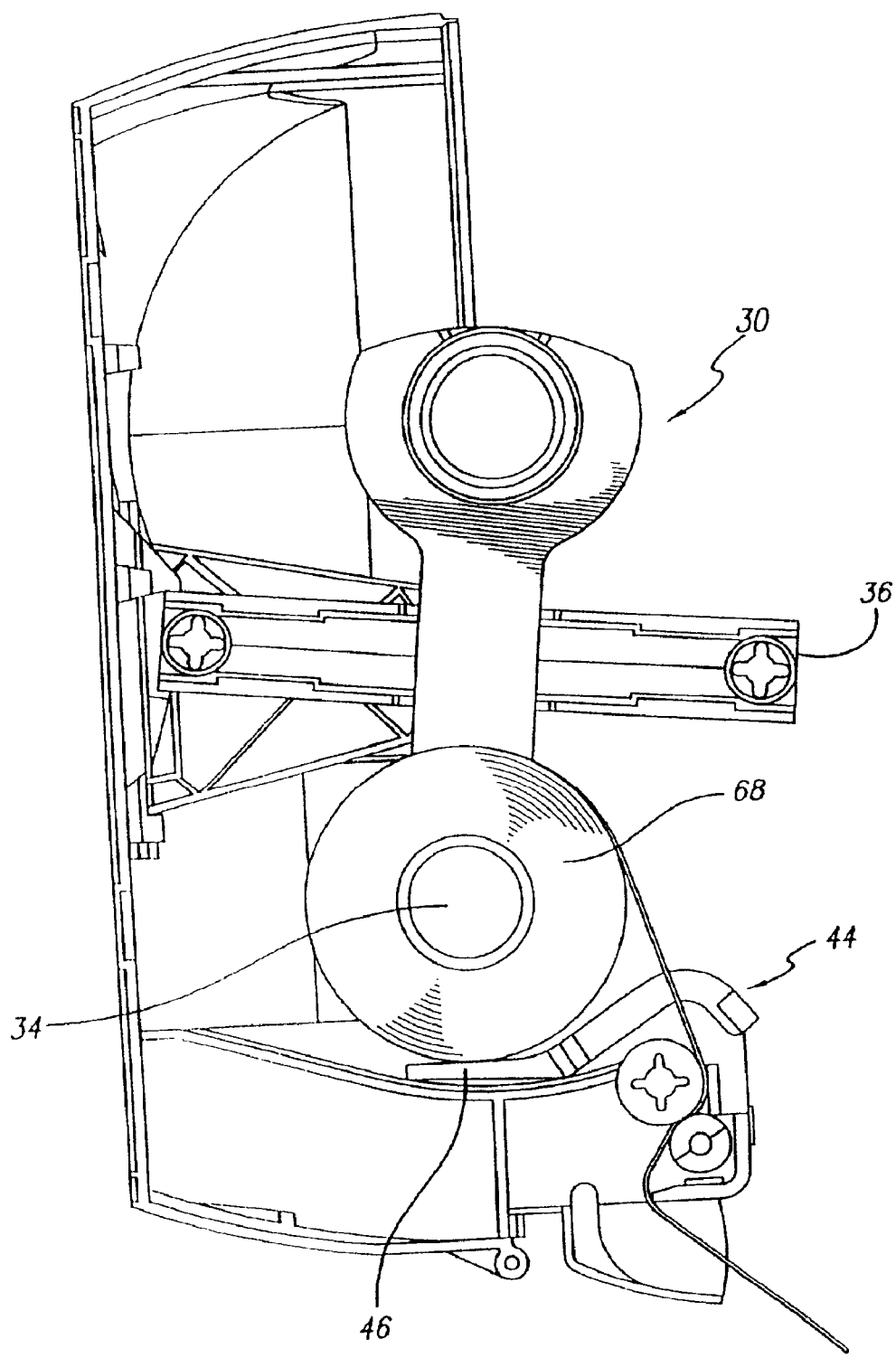
FIG. 7B is a side elevation view of the locking bar being pulled forwardly to allow the carousel to rotate 180°, placing the main roll in the previous stub roll position.

FIG. 7B shows the process of loading where the service person pulls the locking bar 36 and allows the carousel to rotate 180°, placing the main roll 66 in the previous stub roll 68 position. Now a new full sized roll 66 can be loaded onto the main roll 66 position. The transfer bar 44 automatically resets itself. The transfer bar 44 is spring loaded so as to be disposed with the transfer bar legs 46 pressed upward against the stub roll 68 or the stub roll core 84. The transfer bar legs 46 are adapted to be disposed inward of the roll hubs 34 so the bar 88 of the transfer bar 44 will have a positive stop at a more rigid location, in this case, the top of the electronics module 132 (FIG. 2).

FIG. 7C shows the extension springs 126, 128 which tend to maintain the transfer bar legs 46 in contact with the stub roll 68 or stub roll core 84. The transfer bar 44 contains the two extension springs 126, 128. The spring forces are typically 0.05 lbf to 0.5 lbf in the bar 44 lowered position and 0.2 lbf to 1.0 lbf in the bar 44 raised position. In this embodiment, the spring forces are 0.2 lbf in the lowered position an 0.43 lbf in the raised position. The force of the two springs 126, 128 is additive so that the transfer bar 44 is subject to a total spring force of 0.4 lbf in the lowered position and 0.86 lbf in the raised position.

Figure 7D:
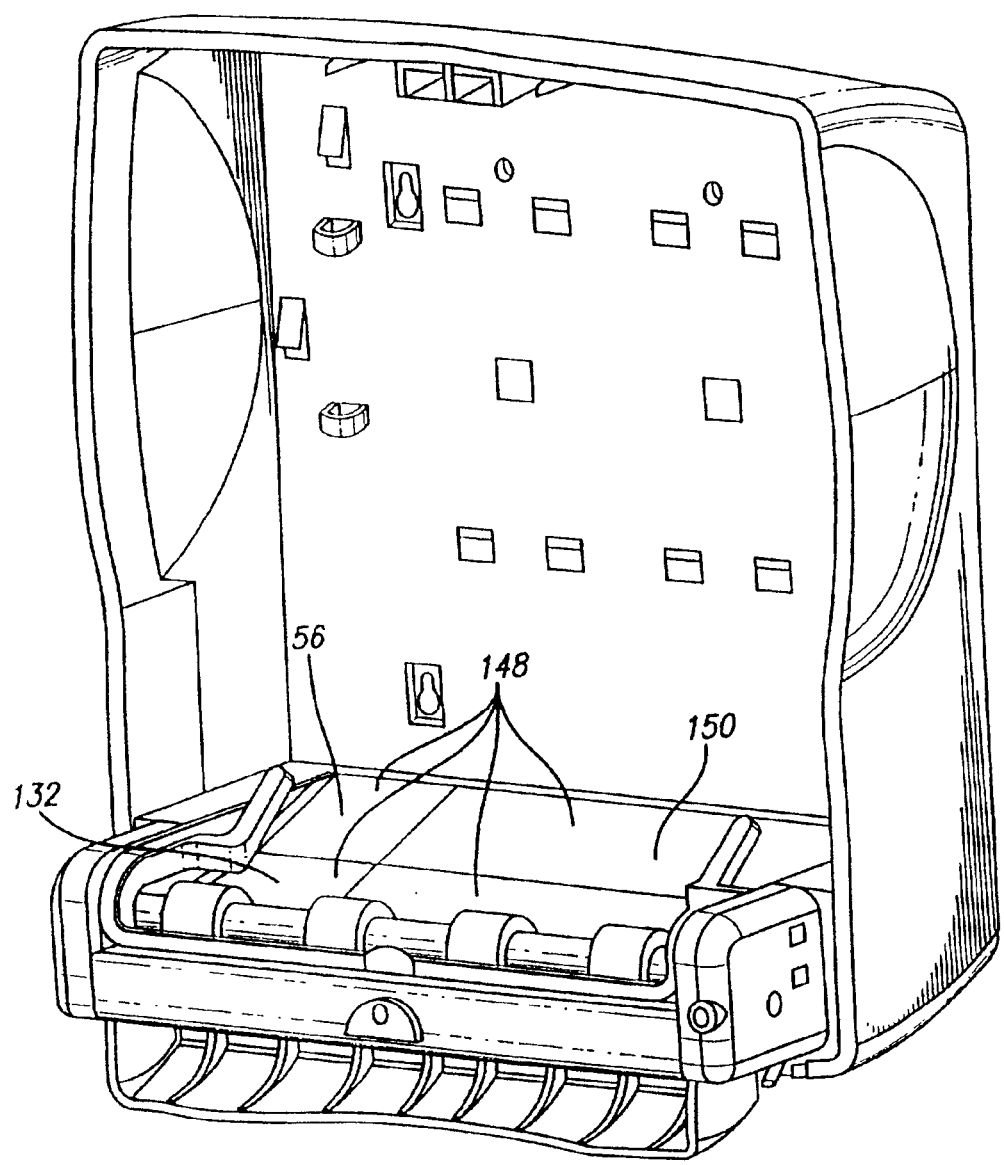
FIG. 7D shows the cleanable floor of the dispenser.

While modular units (FIG. 7D) such as the electronics module 132, the motor 56 module, and the battery case 150, are removable, they fit, or "snap" together so that the top of the electronics unit 132, the top of the motor 56 module and remaining elements of the "floor" 148 of the dispensing unit 20 form a smooth, cleanable surface. Paper dust and debris tend to accumulate on the floor 148 of the dispenser 20. It is important that the dispenser 20 is able to be easily cleaned as part of the maintenance procedure. A quick wiping with a damp cloth will sweep out and pick up any undesirable accumulation. The removable modular dispensing shelf 64 may be removed for rinsing or wiping.

The feed roller 50 may be driven by a motor 56 which in turn may be driven by a battery or batteries 58, driven off a 100 or 220V AC hookup, or driven off a transformer which is run off an AC circuit. The batteries may be non-rechargeable or rechargeable. Rechargeable batteries may include, but not be limited to, lithium ion, metal hydride, metal-air, nonmetal-air. The rechargeable batteries may be recharged by, but not limited to, AC electromagnetic induction or light energy using photocells.

A feed roller 50 serves to feed the paper towel being dispensed onto the curved dispensing ribs 52. A gear train (not visible) may be placed under housing 86, (FIG. 3) for driving the feed roller. A control unit 54 (FIG. 3) for a motor 56 (FIG. 3) may be utilized. A proximity sensor (not shown) or a hand-operated switch 64 may serve to turn the motor 56 on and off.

As an enhancement and further development of a system for delivering paper towel to the end user in as cost effective manner and user-friendly manner as possible, an automatic means for dispensing the paper towel is desirable, making it unnecessary for a user to physically touch a knob or a lever. Therefore, a more hygienic dispenser is present. This dispenser will contribute to less transfer of matter, whether dirt or bacteria, from one user to the next. The results of washing ones hands will tend to be preserved and hygiene increased.

An electronic proximity sensor is included as part of the paper towel dispenser. A person can approach the paper towel dispenser, extend his or her hand, and have the proximity sensor detect the presence of the hand. Upon detection of the hand, a motor is energized which dispenses the paper towel. It has long been known that the insertion of an object with a dielectric constant into a volume with an electromagnetic field will tend to modify the properties, which the electromagnetic field sees. The property of the hand, a dielectric constant close to that of water, is enough to alter the net capacitance of a suitable detector circuit.

Figure 8A:
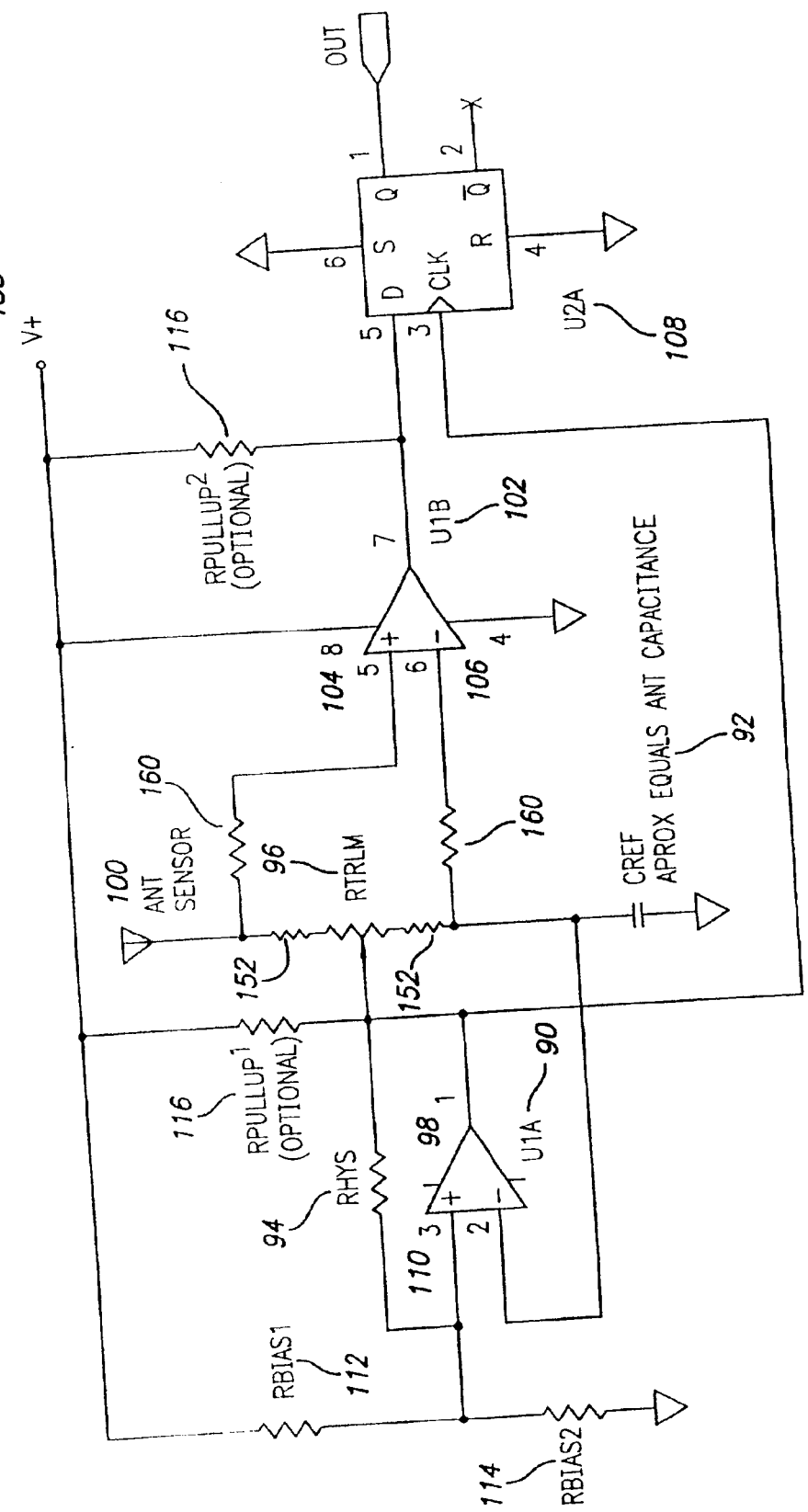
FIG. 8A shows a schematic of the proximity circuit.
Figure 9:
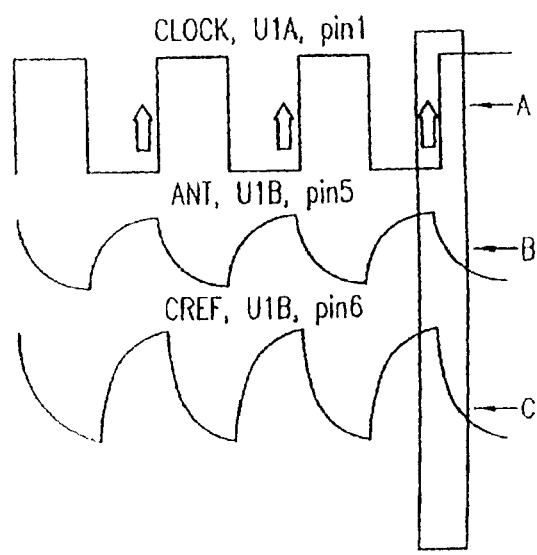
FIG. 9A shows the square wave output at U1A, pin 1.
FIG. 9B shows the RC exponential waveforms at pins 5.
FIG. 9C shows the RC exponential waveforms at pin 6.

An embodiment of the invention comprises a balanced bridge circuit. See FIG. 8A. The component U1A 90 is a comparator (TLC3702 158) configured as an oscillator. The frequency of oscillation of this component, U1A 90, of the circuit may be considered arbitrary and non-critical, as far as the operation of the circuit is concerned. The period of the oscillator is set by the elements Cref 92, Rhys 94, the trim resistance, Rtrim 96, where the trim resistance may be varied and the range resistors Rrange 152 are fixed. The resistors Rrange 152 allow limits to be placed on the range of adjustment, resulting in an easier adjustment. The adjustment band is narrowed, since only part of the total resistance there can be varied. Consequently a single potentiometer may be used, simplifying the adjustment of Rtrim 96. A value for Rrange 152 for the schematic shown in FIG. 8A might be 100 kΩ. Rtrim 96 might have an adjustment range of 10 kΩ to 50 kΩ. The output signal at pin 1 98 of component U1A 90 is a square wave, as shown in FIG. 9A. Cref 92 is charged by the output along with ANT 100, both sustaining the oscillation and measuring the capacitance of the adjacent free space. The signals resulting from the charging action are applied to a second comparator, U1B 102, at pin 5 104 and pin 6 106 (FIG. 8A). These signals appear as exponential waveforms, as shown in FIG. 9B and FIG. 9C.

Figure 8B:
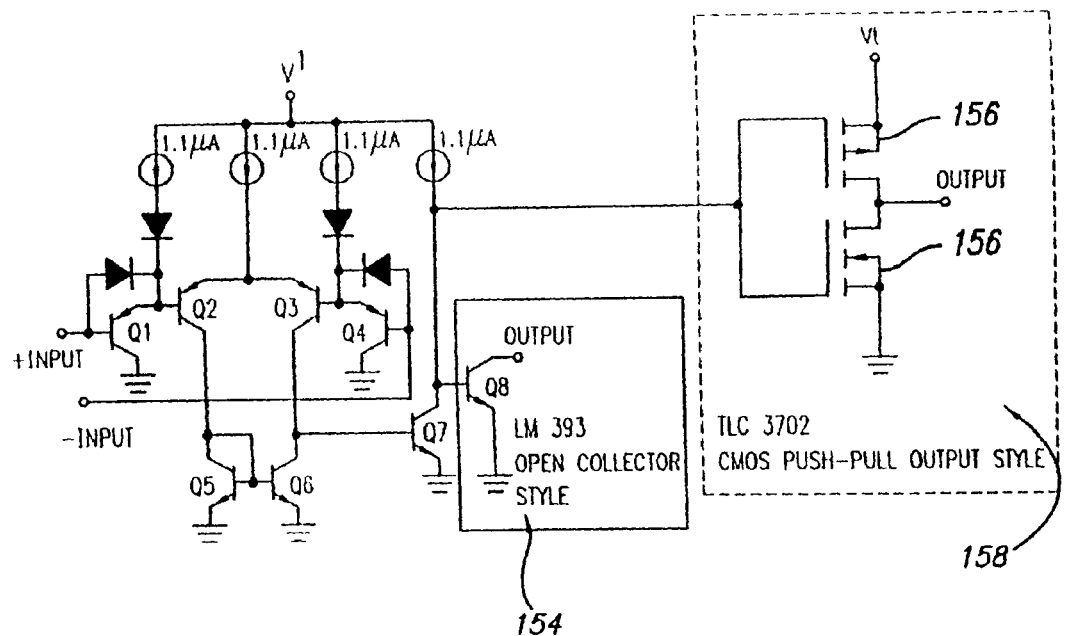
FIG. 8B (prior art) shows the schematic for the National Semiconductor dual comparator LM393.

The simplest form of a comparator is a high-gain differential amplifier, made either with transistors or with an op-amp. The op-amp goes into positive or negative saturation according to the difference of the input voltages because the voltage gain is typically larger than 100,000, the inputs will have to be equal to within a fraction of a millivolt in order for the output not to be completely saturated. Although an ordinary op-amp can be used as comparator, there are special integrated circuits intended for this use. These include the LM 306, LM311, LM393 154 (FIG. 8A), LM393V, NE627 and TLC3702 158. The LM393V is a lower voltage derivative of the LM393 154. The LM393 154 is an integrated circuit containing two comparators. The TLC3702 158 is a micropower dual comparitor with CMOS push-pull 156 outputs. FIG. 8B (prior art) is a schematic which shows the different output structures for the LM393 and the TLC3702. The dedicated comparators are much faster than the ordinary op-amps.

The output signal at pin 198 of component U1A, e.g., a TL3702 158, is a square wave, as shown in FIG. 2A. Two waveforms are generated at the inputs of the second comparator, U2B 102. The first comparator 90 is running as an oscillator producing a square-wave clocking signal, which is input, to the clock input of the flip-flop U2A 108, which may be, for example, a Motorola D flip-flop, No. 14013.

Running the first comparator as a Schmitt trigger oscillator, the first comparator U1A is setup to have positive feedback to the non-inverting input, terminal 3 110. The positive feedback insures a rapid output transition, regardless of the speed of the input waveform. Rhys 94 is chosen to produce the required hysteresis, together with the bias resistors Rbias1 112 and Rbias2 114. When these two bias resistors, Rbias1 112, Rbias2 114 and the hysteresis resistor, Rhys 94, are equal, the resulting threshold levels are ⅓ V+ and ⅔ V+, where V+ 158 is the supply voltage. The actual values are not especially critical, except that the three resistors Rbias1 112, Rbias2 114 and Rhys 94, should be equal, for proper balance. The value of 294 kΩ maybe used for these three resistors, in the schematic shown in FIG. 8A.

An external pullup resistor, Rpullup1 116, which may have a value, for example, of 470 Ω, is only necessary if an open collector comparator such as an LM393 154 is used. That comparator 154 acts as an open-collector output with a ground-coupled emitter. For low power consumption, better performance is achieved with a CMOS comparator, e.g., TLC3702, which utilizes a cmos push-pull output 156. The signal at terminal 3 110 of U1A charges a capacitor Cref 92 and also charges an ANT sensor 100 with a capacitance which Cref 92 is designed to approximate. A value for Cref for the schematic of FIG. 8A, for the most current board design, upon which it depends, is about 10 pF. As the clocking square wave is effectively integrated by Cref 92 and the capacitance of ANT 100, two exponential signals appear at terminals 5 104 and 6 106 of the second comparator U1B, through the Rprotect 160 static protection resistors. Rprotect 160 resistors provide limiting resistance which enhances the inherent static protection of a comparitor input lines, particularly for the case of pin 5 104 of U1B 102. In the schematic shown in FIG. 8A, a typical value for Rprotect 160 might be 2 kΩ. One of the two exponential waveforms will be greater, depending upon the settings of the adjustable resistance Rtrim 96, Cref 92, and ANT 100. The comparator U1B 102 resolves small differences, reporting logic levels at its output, pin7 118. As the waveforms may initially be set up, based on a capacitance at ANT 100 of a given amount. However, upon the intrusion of a hand, for example, into the detection field of the antenna ANT 100, the capacitance of ANT 100 is increased significantly and the prior relationship of the waveforms, which were set with ANT 100 with a lower capacitance, are switched over. Therefore, the logic level output at pin 7 118 is changed and the d flip-flop 108 state is changed via the input on pin 5 of the D flip-flop 108.

The second comparator 102 provides a digital quality signal to the D flip-flop 108. The D flip-flop, U2A 108, latches and holds the output of the comparator U1B 90. In this manner, the second comparator is really doing analog-to-digital conversion. A suitable D flip-flop is a Motorola 14013.

The presence, and then the absence, of a hand can be used to start a motorized mechanism on a paper towel dispenser, for example. An embodiment of the proximity detector uses a single wire or a combination of wire and copper foil tape that is shaped to form a detection field. This system is very tolerant of non-conductive items, such as paper towels, placed in the field. A hand is conductive and attached to a much larger conductor to free space. Bringing a hand near the antenna serves to increase the antenna's apparent capacitance to free space, forcing detection.

The shape and placement of the proximity detector's antenna (FIG. 8A, 100) turns out to be of some importance in making the proximity sensor work correctly. Experimentation showed that a suitable location was toward the lower front of the dispenser unit. The antenna (FIG. 8A, 100) was run about two-thirds the length of the dispensing unit, in a modular, replaceable unit above the removable dispensing shelf 62 (FIG. 3). This modular unit would be denoted on FIG. 3 as 120.

A detection by the proximity detection circuit (FIG. 8A) in the module 120 sets up a motor control flip flop so that the removal of the hand will trigger the start of the motor cycle. The end of the cycle is detected by means of a limit switch which, when closed, causes a reset of the flip-flop and stops the motor. A cycle may also be initiated by closing a manual switch.

A wide range of sensitivity can be obtained by varying the geometry of the antenna and coordinating the reference capacitor. Small antennae have short ranges suitable for non-contact pushbuttons. A large antenna could be disposed as a doorway-sized people detector. Another factor in sensitivity is the element applied as Rtrim. If Rtrim 96 is replaced by an adjustable inductor, the exponential signals become resonant signals with phase characteristics very strongly influenced by capacitive changes. Accordingly, trimming with inductors may be used to increase range and sensitivity. Finally, circuitry may be added to the antenna 100 to improve range and directionality. As a class, these circuits are termed "guards" or "guarding electrodes," old in the art, a type of shield driven at equal potential to the antenna. Equal potential insures no charge exchange, effectively blinding the guarded area of the antenna rendering it directional.

The antenna design and trimming arrangement for the paper towel dispenser application is chosen for adequate range and minimum cost. The advantages of using a guarded antenna and an adjustable inductor are that the sensing unit to be made smaller.

From a safety standpoint, the circuit is designed so that a detection will hold the motor control flip-flop in reset, thereby stopping the mechanism. The cycle can then begin again after detection ends.

The dispenser has additional switches on the control module 54. FIG. 3 shows a "length-of-towel-to-dispense-at-one-time" ('length') switch 134. This switch 134, is important in controlling how long a length of paper towel is dispensed, for each dispensation of towel. It is an important setting for the owner of the dispenser on a day-to-day basis in determining cost (to the owner) versus the comfort (to the user) of getting a large piece of paper towel at one time.

A somewhat similar second switch 136 is "time-delay-before-can-activate-the-dispensing-of another-paper-towel" ("time-delay") switch 136. The longer the time delay is set, the less likely a user will wait for many multiple towels to dispense. This tends to save costs to the owner. Shortening the delay tends to be more comfortable to a user.

A third switch 138 is the sensitivity setting for the detection circuit. This sensitivity setting varies the resistance of Rtrim 96 (FIG. 8A). Once an effective antenna 100 (FIG. 8A) configuration is set up, the distance from the dispenser may be varied. Typical actual use may require a sensitivity distance out to one or two inches, rather than four or six inches. This is to avoid unwanted dispensing of paper towel. In a hospital setting, or physician's office, the sensitivity setting might be made fairly low so as to avoid unwanted paper towel dispensing. At a particular work location, on the other hand, the sensitivity might be set fairly high, so that paper towel will be dispensed very easily.

While it is well known in the art how to make these switches according to the desired functionality, this switch triad may increase the usefulness of the embodiment of this invention. The system, as shown in the embodiment herein, has properties of lowering costs, improving hygiene, improving ease of operation and ease of maintenance. This embodiment of the invention is designed to consume low power, compatible with a battery or battery pack operation. In this embodiment, a 6 volt DC supply is utilized. A battery eliminator may be use for continuous operation in a fixed location. There is a passive battery supply monitor that will turn on an LED indicator if the input voltage falls below a specified voltage.

The most spectacular example of a build-up of static electric charge caused by mechanical separation of charge is the giant thunderstorm, with violent displays of lightning and the associated thunder. A more quiet but more pernicious static buildup problem is that associated with the destruction of electronic integrated circuit chips by unwanted static discharge to susceptible circuit leads. A common occurrence of the discharge of a mechanically-caused static charge buildup happens when a person becomes charged-up walking on a rug on a dry, typically cold, day and has an unpleasant but non-injurious experience of discharging that charge by contacting a grounded object.

A similar situation occurs on a paper towel dispenser. Here, however, the separation of charge tends to be caused as a paper towel is separated from the main roll by being ripped-off along a guide bar, or a smooth or serrated blade. Some mechanical charge separation may also occur from the action of the paper towel web sliding along rib-structures and rollers of the dispenser. In many places where a paper towel dispenser is placed there is no, or no convenient access, to a ground wire or conduit of a 110V or 220 V electrical supply system or grounding rods or other ground-to-earth conductor.

Consequently, the approach of this invention is used instead. To ground static electricity buildup on a paper towel dispenser, a high conductivity grounding wire connects internal components of the dispenser that are subject to accumulating static electric charge. The high conductivity grounding wire connects to an electrical mechanical contact on the outside of the dispenser. A metal contact between the high conductivity pathway, and for example, the wall against which the dispenser is mounted, provides an electrical pathway for the dissipation of the static electrical build up on the dispenser to a local electrical ground.

Figure 10A:
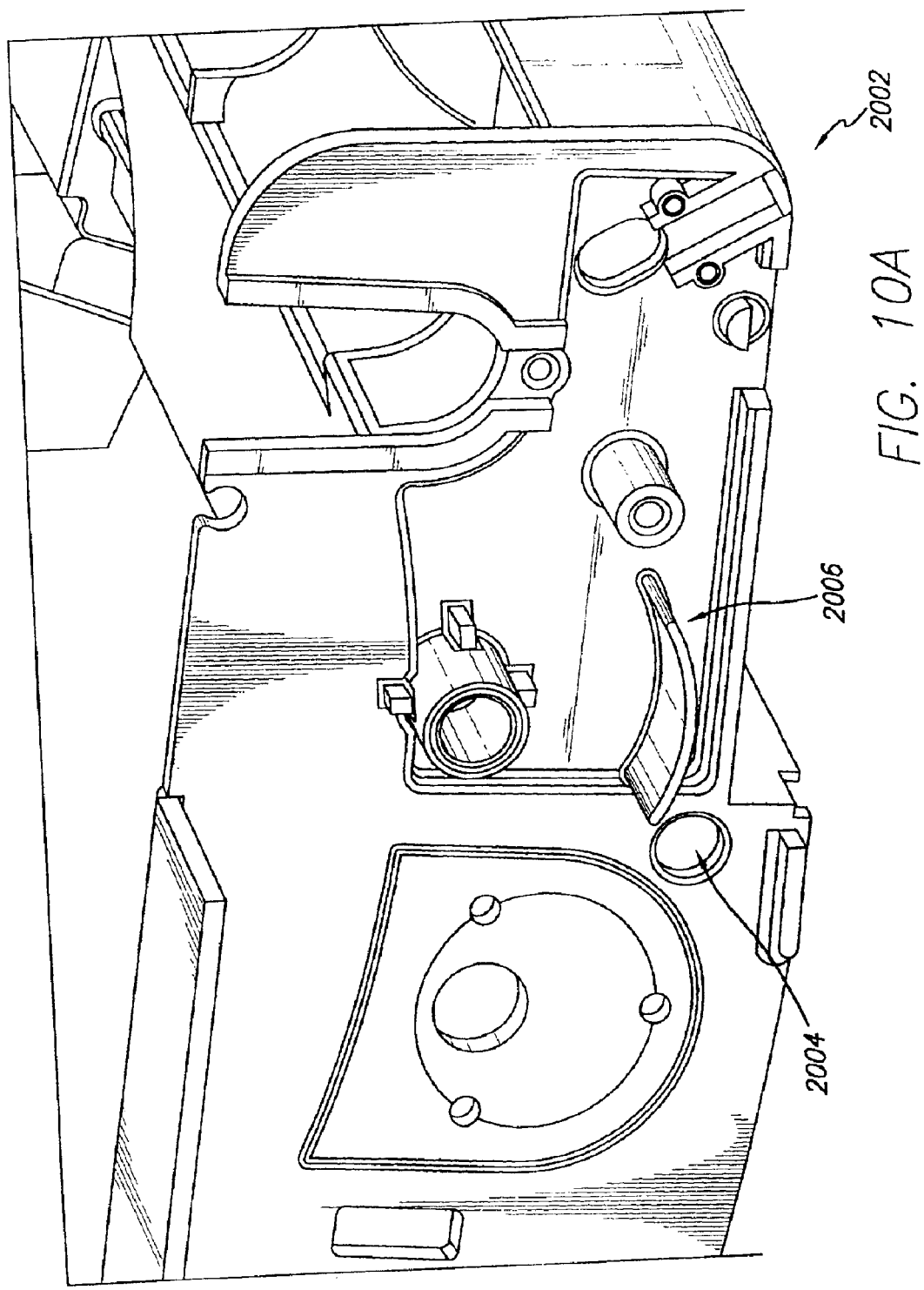
FIG. 10A is a perspective view of a paper towel dispenser with an access hole for the grounding wire and shows a molded rib which prevents the low impedance grounding wire from contacting an idler gear.

The first step is to provide a low impedance pathway for collecting the static electric charge on the dispenser and bringing it to a wall contact. FIG. 10A shows a side of a paper towel dispenser 2002 with an access hole 2004 for the grounding wire (not shown) and shows a molded rib 2006 which prevents the low impedance grounding wire (not shown) from contacting an idler gear. The idler gear is not shown. This rib 2006 may be molded into the structure. The rib helps to route the grounding wire out of the way of a potentially interfering mechanism. The grounding wire 2016 may be seen in FIG. 11B. The access hole provides a convenient entrance so as to allow the routing of the low impedance grounding wire to the rear wall contact.

Figure 10B:
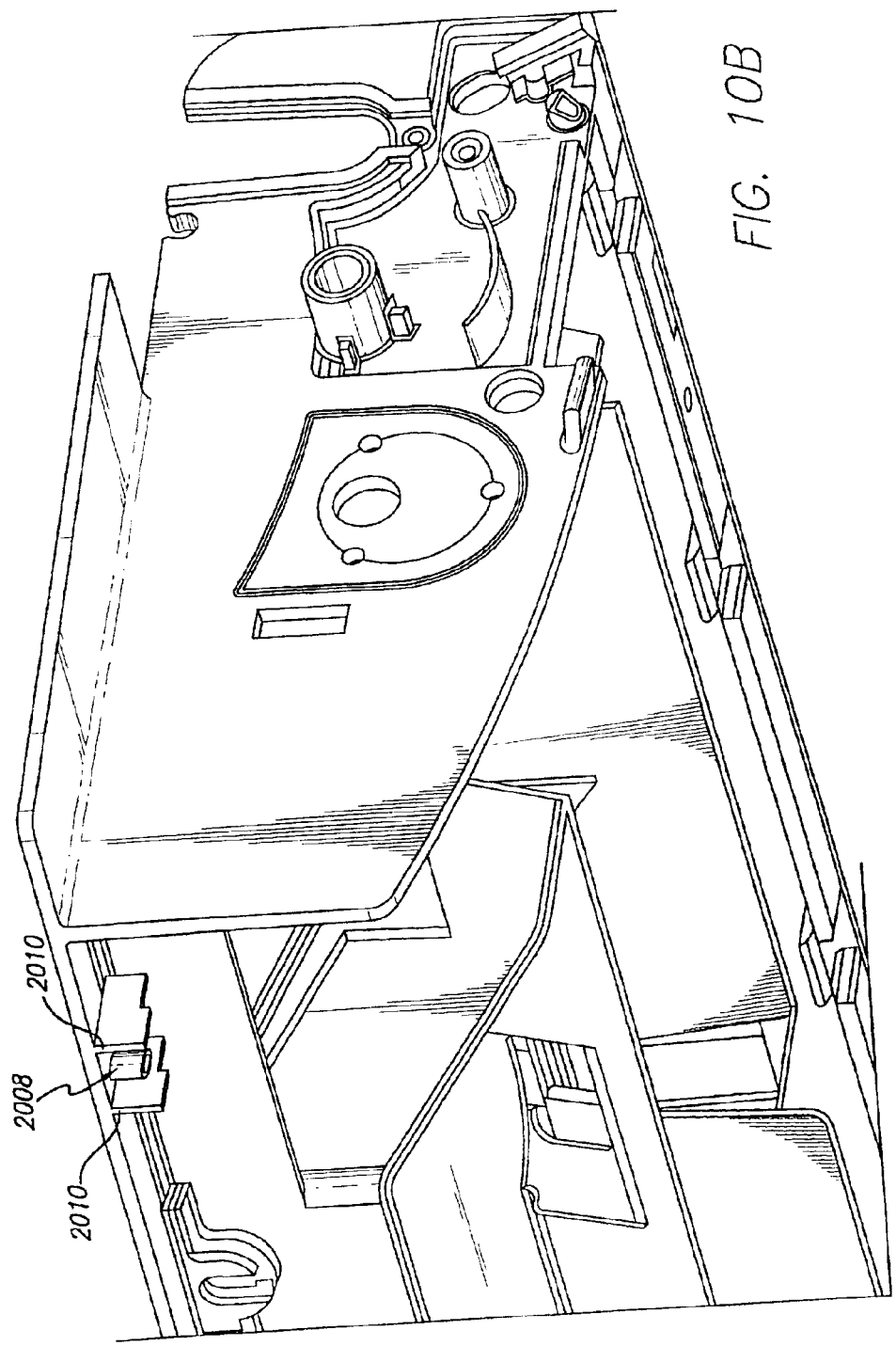
FIG. 10B is a perspective view a screw boss and molded ribs for attaching the wall contact spring grounding clip to the chassis of the dispenser.
Figure 10C:
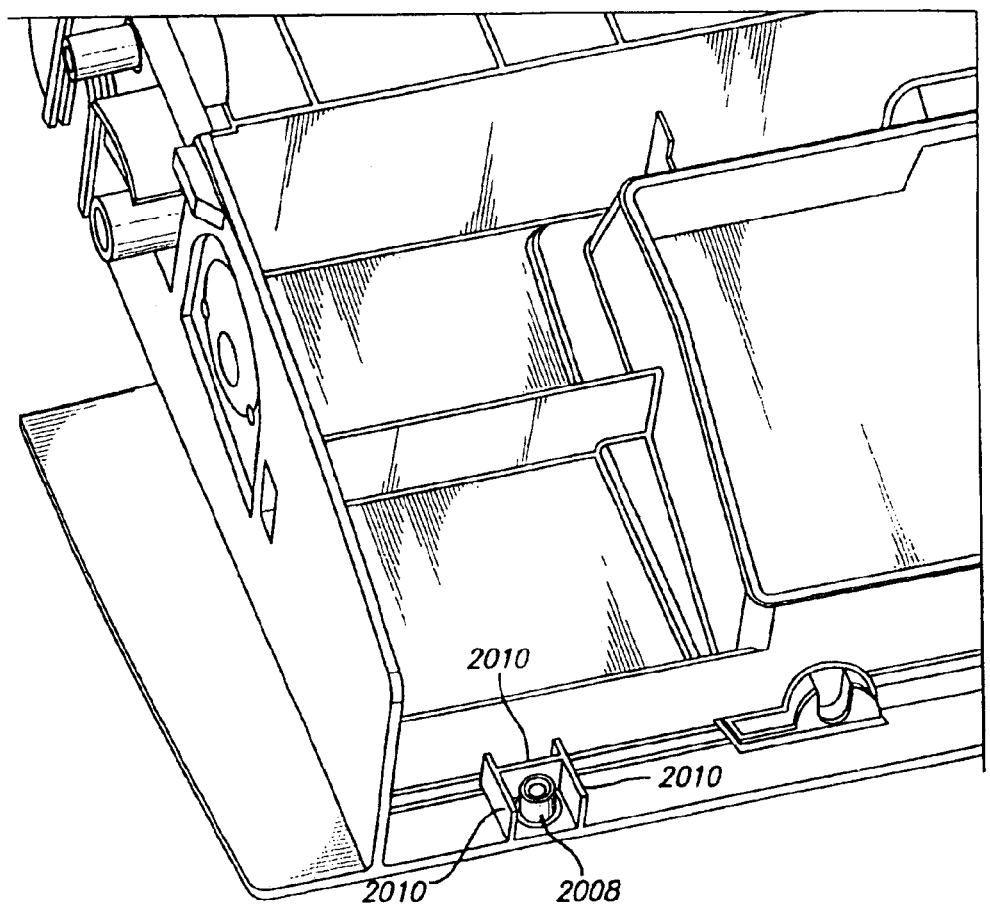
FIG. 10C is another perspective view of the screw boss and ribs for attaching the wall contact spring grounding clip to the chassis.

Features of the chassis structure provide an approach to securing both the grounding wire 2016 (FIGS. 11B, 11C, 14) to the rear wall contact 2020 (FIGS. 11C, 12, 13B) and securing the metal wall contact 2020 to the chassis of the dispenser. For the wall contact (not shown) there is a screw 2008 (FIG. 10C) and ribs 2010 (FIG. 10C) for attaching the wall contact to the chassis. This is seen in FIG. 10B and in a different view from FIG. 10C. The wall contact may be screwed to the chassis and the grounding wire secured to the wall contact with the same screw.

Figure 11B:
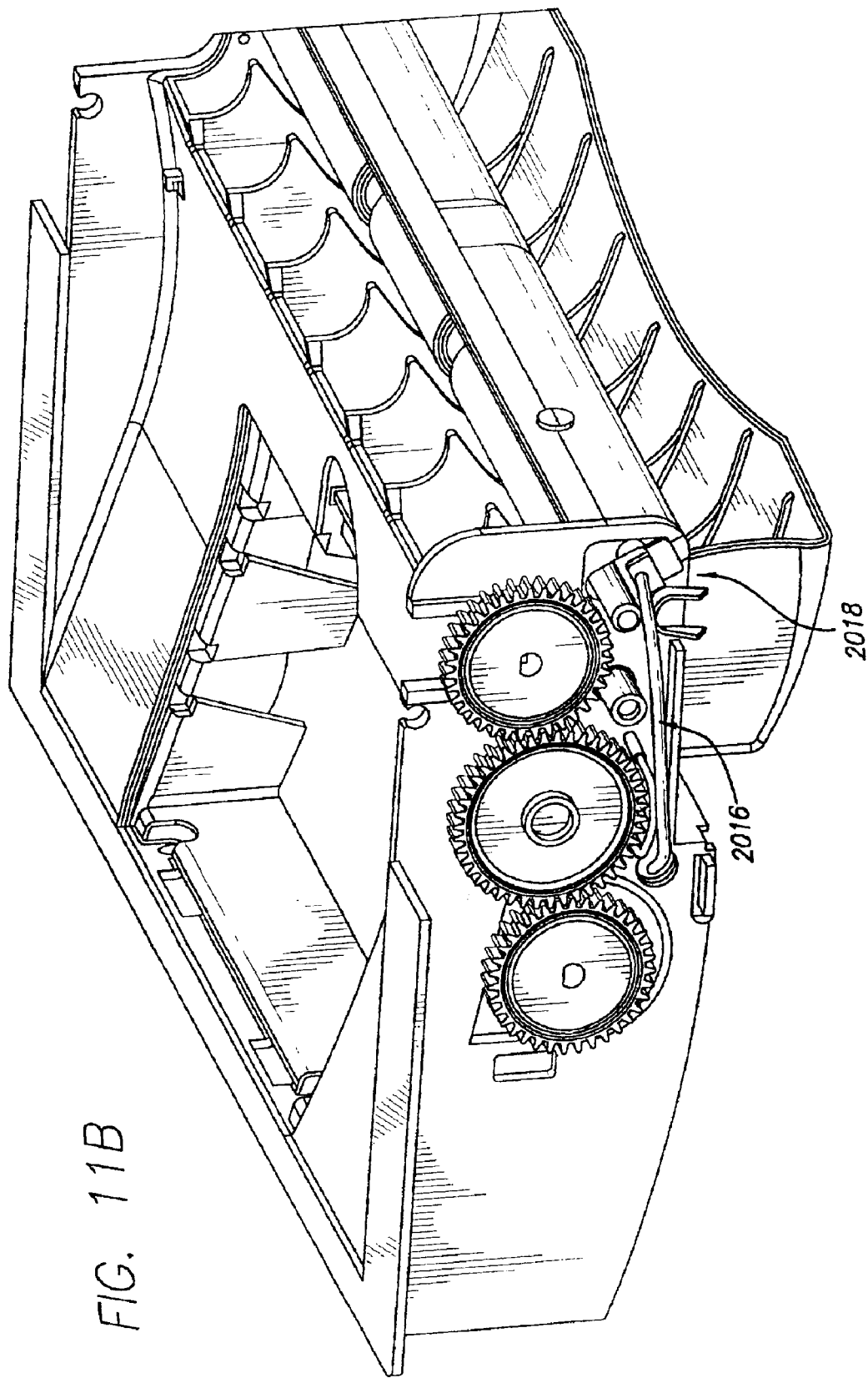
FIG. 11B is a perspective view of the grounding wire contacting the spring clip and entering an access hole toward its other end.

Since the nib rollers tend to pick up the initial static electric charge, the grounding wire is run from the nib rollers to the wall contact. Thus FIG. 11A shows the gear cover 2012 with a rib 2014 molded into it, which holds the spring clip 2018 (FIGS. 11C, 12, 13B) in place. Keeping the grounding wire in a relatively straight line from the charge collection near the charge generation source allows a minimum length for the grounding wire 2016 (FIGS. 11B, 11C).

Figure 11C:
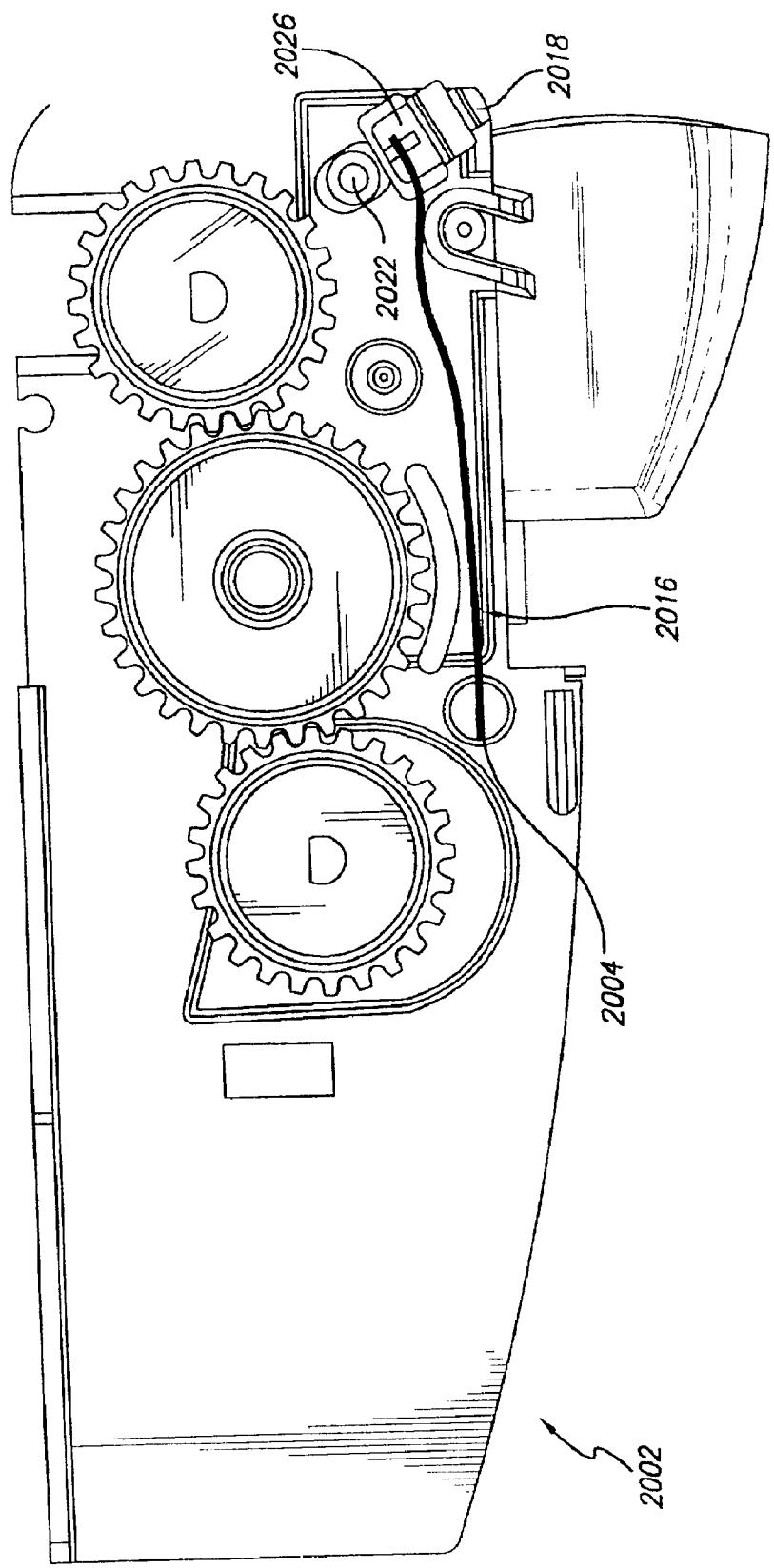
FIG. 11C is a side elevational view of the towel dispenser showing the grounding wire, the spring contact which connects to the grounding wire and also connects to the wall contact spring grounding clip.
Figure 12:
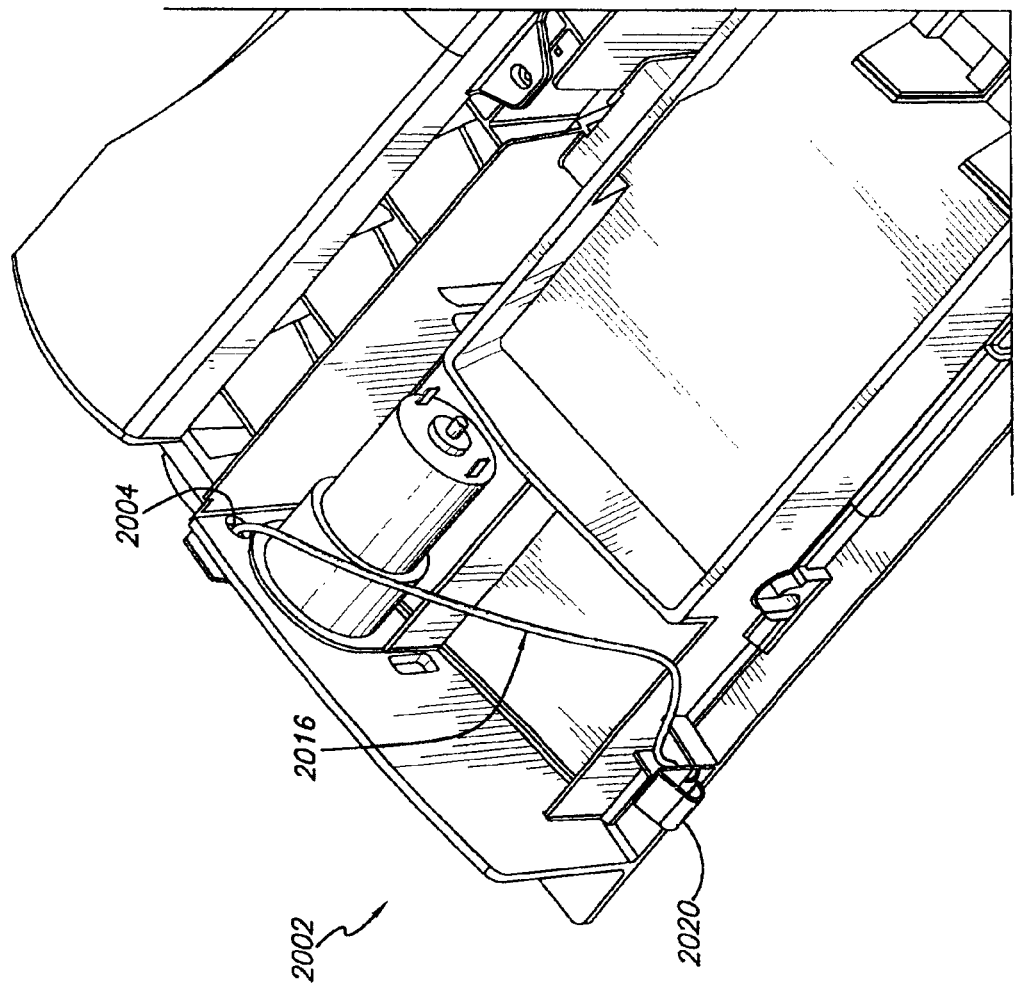
FIG. 12 is a perspective view of the path of the grounding wire after it enters the access hole.

The actual contacting is of the grounding wire 2016 to a spring clip 2018, by a spring clip attachment means (2026, FIG. 11C). The spring has a spring clip means as part of its structure. FIG. 11B shows the grounding wire 2016 and its connection to the spring clip 2018 (FIGS. 11C, 12, 13B). A compression spring 2019 (FIG. 15) contacts the metal nib roller shaft (2022, FIG. 14) by spring pressure, providing a mechanical and electrical contact. The static electricity accumulated on the nib rollers may transfer from the nib rollers to the metal nib roller shaft (2022, FIGS. 11B, 11C, 14). Then the static electricity may transfer through the spring clip 2018 to the grounding wire 2016. The ground wire 2016 is held by a spring clip means (2026, FIG. 14) to the spring clip 2018 (FIGS. 11C, 12, 13B).

FIG. 12 is a perspective view showing the wall contact spring grounding clip 2020 and the ground wire 2016, which is partially hidden as it enters the access hole 2004. The wall contact spring grounding clip 2020 is on the rear side of the paper towel dispenser. It is connected to the grounding wire 2016, which is hidden by part of the structure of the dispenser 2002. In FIG. 11C, toward the front side of the dispenser 2002, the grounding wire 2016 is connected to the spring clip 2018 that electrically and mechanically connects to the nib roller shaft 2022 by spring pressure. As FIG. 11C shows, the grounding contact runs from the nib roller (not shown) to the metal nib roller shaft 2022 through a spring clip 2018 (FIGS. 11C, 12, 13B). The ground contact continues through the grounding wire 2016 to the wall contact spring grounding clip 2020. When the dispenser 2002 is mounted on a wall, the wall contact spring grounding clip 2020, acting as a partially compressed spring, presses against the wall to maintain a mechanical pressure contact which provides an electrical conduction path to the wall from the static build up areas on the towel dispenser 2002.

FIG. 12 shows the pathway of the grounding wire 2016 from where it enters the access hole 2004 toward the interior of the dispenser 2002. The grounding wire 2016 continues until it contacts the wall contact spring grounding clip 2020.

The ground wire 2016 is attached to the wall contact spring grounding clip 2020 by screw, bolt, soldering or other common methods of affixing a grounding wire to a metal contact which serves to complete a grounding path.

It may be appreciated that a dispenser may be made of alternative materials or combinations of materials. For example, in the case where the rear chassis of the dispenser is made of galvanized steel or stainless steel, the chassis itself may be formed with one or more integral spring wall contacts. The grounding wire, in these embodiments, may be attached by a means including, but not limited to, screw, bolt, soldering, brazing, or welding. In another embodiment, the rear chassis may be of a plastic, but having metal straps. These metal straps may also be formed with one or more integral spring contacts. The grounding wire may then be attached to the metal straps. Again, the dispenser may be made completely of metal, for example, stainless steel. In this embodiment, the grounding wire system may be used, or, the electrical grounding path may be from the spring contact, which presses against the nib roller, to the metal paper towel dispenser casing to the rear wall, by way of one or more integral spring wall contacts.

Figure 13A:
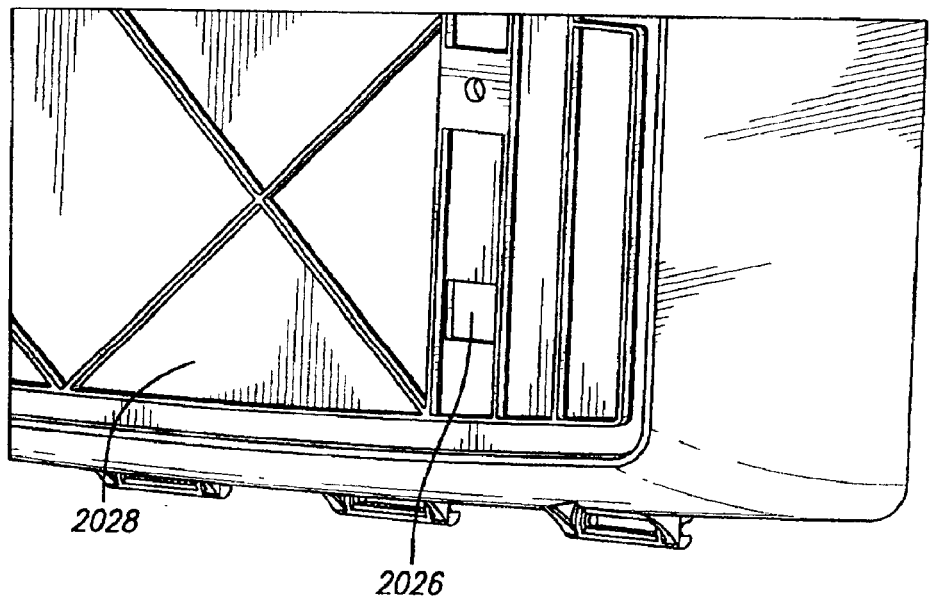
FIG. 13A is a rear, perspective view of the opening for the wall contact spring grounding clip of the towel dispenser.
Figure 13B:
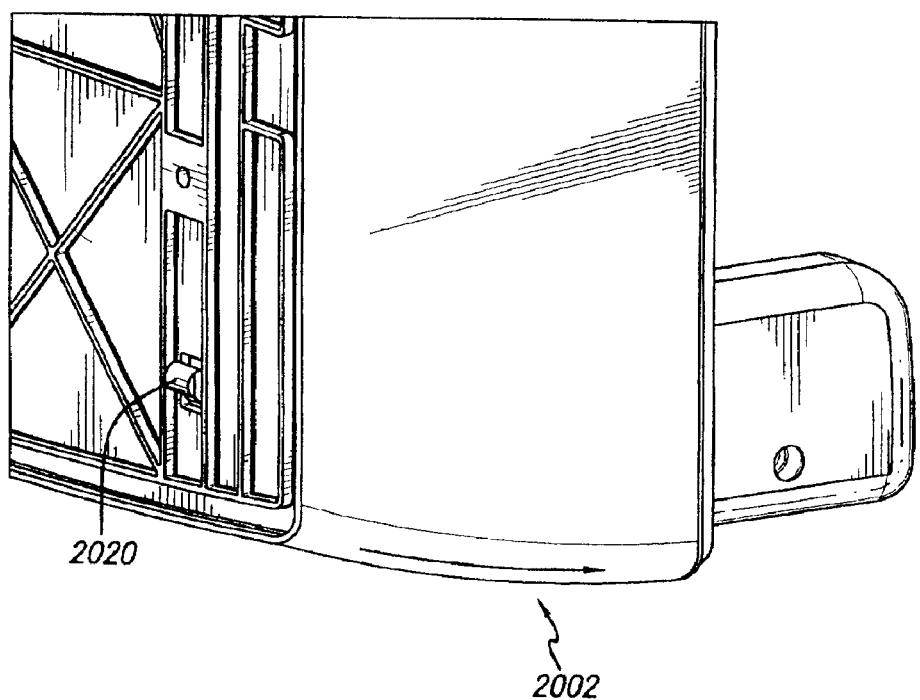
FIG. 13B is a perspective view of the wall contact spring grounding clip in place in the back of the paper-towel-dispensing unit.

FIG. 13A shows the opening 2026 in the rear cover 2028 for the wall contact spring grounding clip. The placement of the opening tends to be determined by keeping a shortest grounding wire, together with structural manufacturing considerations for the paper towel dispenser chassis.

FIG. 13B shows the wall contact spring grounding clip 2020 in place, ready for the paper towel dispensing unit 2002 to be mounted in such a way as to press that wall contact spring grounding clip against the wall and maintain a good mechanical and electrical contact.

Figure 15:
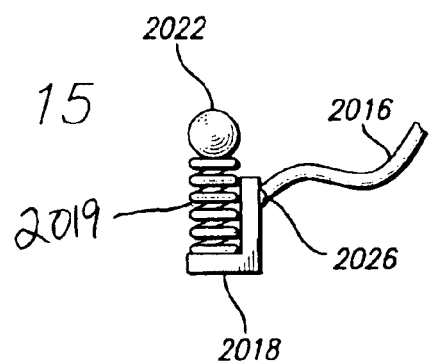
FIG. 15 is an elevational view showing the compression spring.
Figure 14:
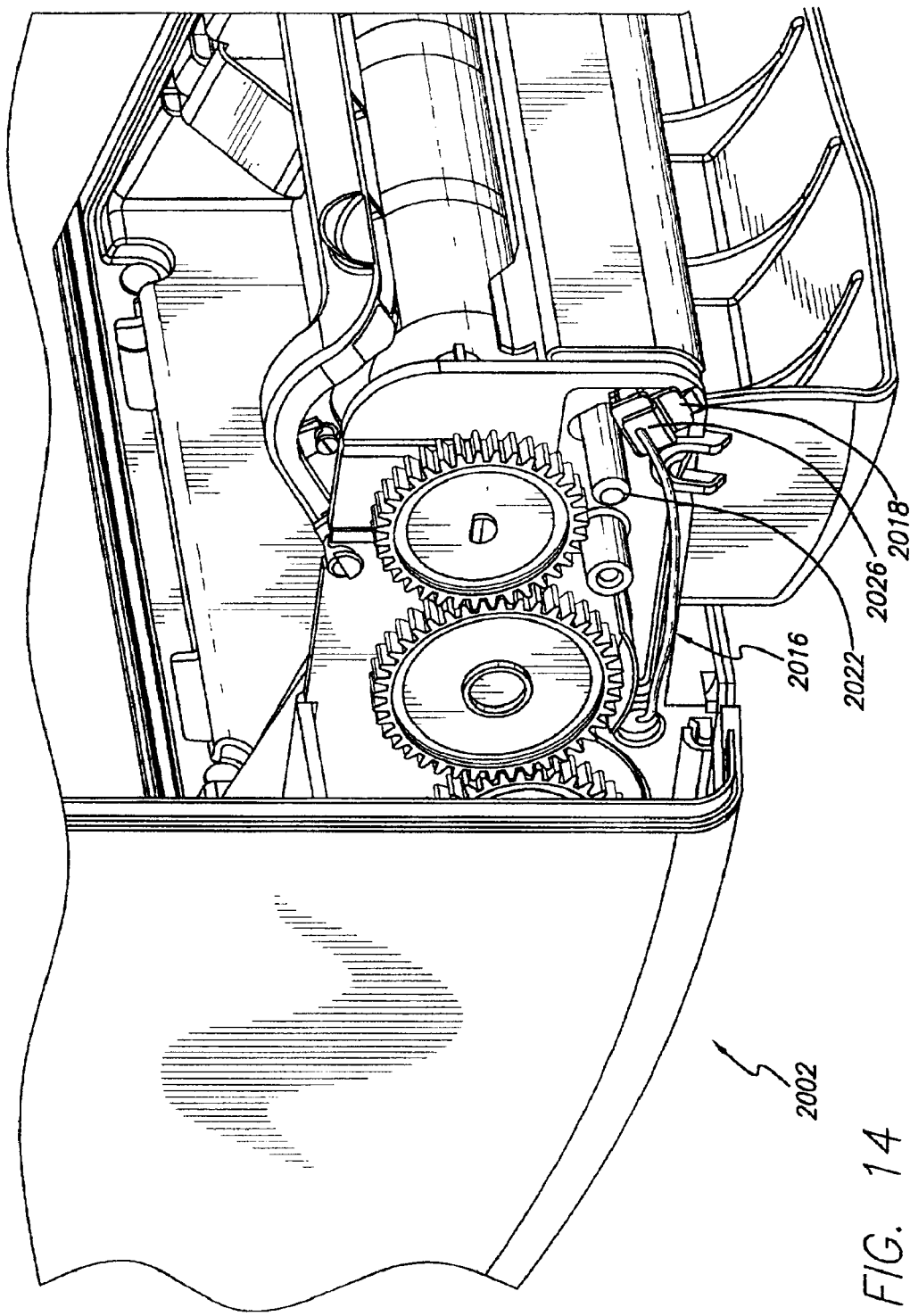
FIG. 14 is a perspective view of the static charge flow path including the nib roller to the nib roller shaft, the compression spring, the spring contact, and the grounding wire

FIGS. 14 and 15 illustrate the dispenser 2002 with the front cover removed, shows further details of the connection from the nib roller (not shown) to the metal nib roller shaft 2022 and then through a spring clip 2018 which connects to the nib roller compression spring (not shown) and a spring clip attachment means 2026 connected to the grounding wire 2016 and to the wall contact spring grounding (not shown) clip to the wall (not shown).

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of grounding a battery operated dispenser adapted to dispense paper from a roll of paper disposed within the dispenser, the method comprising:

connecting a low impedance path to elements integral to the dispenser;

connecting said low impedance path to a surface contact spring adapted to directly contact a surface when said dispenser is mounted to the surface; and discharging static electrical charge accumulated on the elements to the surface through the low impedance path and the surface contact spring.

2. The method as in claim 1, wherein the dispenser includes a nib roller and the method further comprises connecting the low impedance path to the nib roller.

3. The method as in claim 2 further comprising connecting a shaft of the nib roller to the low impedance path using a spring contact.

4. A paper dispenser comprising:

a support adapted to hold a roll of a paper;

a motor driven feed mechanism adapted to receive and dispense paper from the roll;

at least one battery electrically coupled to the motor driven feed mechanism;

a surface contact spring adapted to directly contact a mounting surface external to the dispenser when the dispenser is affixed to the mounting surface; and at least one low impedance wire having a first end electrically coupled to the spring and a second end coupled to a surface integral to the dispenser.

5. The dispenser of claim 4, wherein the feed mechanism includes a nib roller and the second end of the at least one low impedance wire is coupled to the nib roller.

6. The dispenser of claim 5, wherein the dispenser further comprises a spring contact coupling the second end of the at least one low impedance wire to the nib roller.

7. The dispenser of claim 5, wherein the nib roller includes a shaft and the spring contact couples the second end of the at least one low impedance wire to the shaft.

* * * * *